(12) United States Patent
Liu

(10) Patent No.: US 12,707,871 B2
(45) Date of Patent: Aug. 11, 2026

(54) DISPLAY PANEL AND DISPLAY DEVICE

(71) Applicant: Xiamen Tianma Display Technology Co., Ltd., Xiamen (CN)

(72) Inventor: Wei Liu, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 427 days.

(21) Appl. No.: 18/244,654

(22) Filed: Sep. 11, 2023

(65) Prior Publication Data

US 2023/0422587 A1 Dec. 28, 2023

(30) Foreign Application Priority Data

Mar. 28, 2023 (CN) ......................... 202310316314.1

(51) Int. Cl.

| | |
|---|---|
| ***H10H 29/14*** | (2025.01) |
| ***H10K 59/131*** | (2023.01) |
| ***H10K 59/40*** | (2023.01) |
| ***H10K 59/80*** | (2023.01) |

(52) U.S. Cl.

CPC ....... *H10K 59/8792* (2023.02); *H10K 59/131* (2023.02); *H10K 59/40* (2023.02)

(58) Field of Classification Search

CPC .. H10K 59/8792; H10K 59/131; H10K 59/40; H10H 29/142; H10H 20/85

See application file for complete search history.

(56) References Cited

U.S. PATENT DOCUMENTS

2022/0113584 A1* 4/2022 Zeng .................... H10K 59/871
2023/0320169 A1* 10/2023 Song .................. H10K 59/8792 257/40

* cited by examiner

*Primary Examiner* — Donald L Raleigh
(74) *Attorney, Agent, or Firm* — KDW FIRM PLLC

(57) ABSTRACT

Provided are a display panel and a display device. The display panel includes a base substrate, a light-emitting element layer, and a light-shielding component. The light-emitting element layer is located on a side of the base substrate and includes multiple light-emitting elements arranged in an array. The light-shielding component is located on a side of the light-emitting element layer facing away from the base substrate. An orthographic projection of the light-shielding component on the base substrate is located between orthographic projections of adjacent light-emitting elements of the multiple light-emitting elements on the base substrate. Different parts of at least one light-shielding component have different widths along a direction parallel to a plane where the display panel is located. Provided is a display device.

24 Claims, 15 Drawing Sheets

Large viewing angle

Front viewing angle

Large viewing angle

RE2

RE1

3101-2

3101-1

3101

DISPLAY PANEL AND DISPLAY DEVICE

CROSS-REFERENCE TO RELATED APPLICATION(S)

This application claims priority to Chinese Patent Application No. 202310316314.1 filed Mar. 28, 2023, the disclosure of which is incorporated herein by reference in its entirety.

TECHNICAL FIELD

The present disclosure relates to the field of display technologies and, in particular, to a display panel and a display device.

BACKGROUND

Display technology is widely used in the fields of televisions, mobile phones, and public display. A variety of display panels are used for displaying the image. With the development of the display panel, images available for the display panel become more and more abundant. Nowadays, the display panel is developing toward a high contrast ratio, high resolution, full-color display, low power consumption, high reliability, and a long service life.

However, the images displayed in the existing display panel often have the color cast, and especially, the color cast is more serious at a large viewing angle, affecting the user experience for the full-color display.

SUMMARY

In view of this, an embodiment of the present disclosure provides a display panel and a display device.

In the first aspect, the present disclosure provides a display panel. The display panel includes a base substrate, a light-emitting element layer, and a light-shielding component.

The light-emitting element layer is located on a side of the base substrate and includes multiple light-emitting elements arranged in an array.

The light-shielding component is located on a side of the light-emitting element layer facing away from the base substrate, where an orthographic projection of the light-shielding component on the base substrate is located between orthographic projections of adjacent light-emitting elements of the multiple light-emitting elements on the base substrate.

Different parts of the light-shielding component have different widths along a direction parallel to a plane where the display panel is located.

In the second aspect, the present disclosure provides a display device. The display device includes the display panel in the first aspect.

The present application can improve the display effect of the display panel and the display device.

BRIEF DESCRIPTION OF DRAWINGS

To illustrate technical solutions in embodiments of the present application more clearly, the drawings used in the description of the embodiments are briefly described below. Apparently, the drawings described below illustrate part of the embodiments of the present application, and those of ordinary skill in the art may obtain other drawings based on the drawings described below on the premise that no creative work is done.

DETAILED DESCRIPTION

Figure 1:
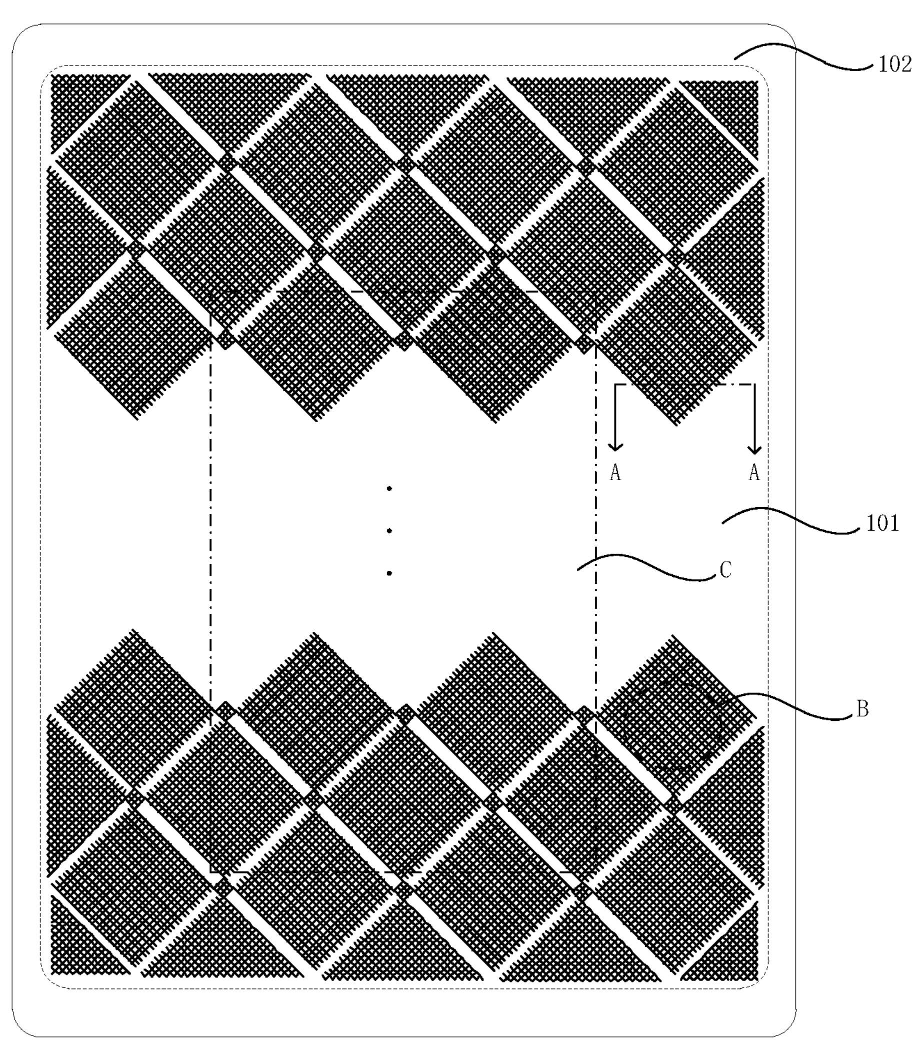
FIG. 1 is a top diagram of a display panel according to an embodiment of the present disclosure.

To obtain a clearer understanding of objects, features, and advantages of the present disclosure, the present disclosure is further described below in conjunction with the drawings and embodiments.

It is to be noted that details are set forth below to facilitate a thorough understanding of the present disclosure. However, the present disclosure can be implemented by various embodiments different from the embodiments described herein, and those skilled in the art may make similar generalizations without departing from the spirit of the present disclosure. Therefore, the present disclosure is not limited to the embodiments disclosed below.

Terms used in the embodiments of the present disclosure are intended only to describe the specific embodiments and not to limit the present disclosure. As used in the embodiments of the present disclosure and the appended claims, the singular forms, including “a”, “an”, and “the”, are intended to include the plural forms as well, unless the context clearly indicates otherwise.

It is to be noted that nouns of locality, including "up", "down", "left", and "right" used in the embodiments of the present disclosure, are described from the perspective of the drawings and are not to be construed as a limitation to the embodiments of the present disclosure. In addition, in the context, it is to be understood that when a component is formed "on" or "below" another component, the component may not only be directly formed "on" or "below" another component, and may also be indirectly formed "on" or "below" another component via an intermediate component.

In addition, example embodiments may be implemented in many forms and not be construed as limited to the embodiments set forth herein; rather, these embodiments are provided so that the present disclosure is thorough and complete and fully conveys the concept of the example embodiments to those skilled in the art. The same reference numerals in the drawings denote the same or similar structures, and thus the description of the same reference numerals is not repeated. The words expressing positions and orientations as used herein are illustrated in the drawings, but may be modified as desired and are intended to be encompassed within the scope of the present disclosure. The drawings of the present disclosure are used for illustrating only the relative positional relationship. The layer thickness of a certain part is marked using the showy drawing method to facilitate understanding. The layer thickness in the drawings does not represent the ratio of the actual layer thickness. If not conflicted, the embodiments herein and the features thereof may be combined with each other. The drawings of the embodiments of the present application are given the same reference numerals. In addition, the description of the same parts of the embodiments is not repeated.

The images displayed in the existing display panel often have the color cast, and especially, the color cast is more serious at a large viewing angle, affecting the user experience for the full-color display.

The inventor has found that light-emitting elements may include light-emitting elements emitting blue light, green light, or red light. Specifically, blue light is the visible light with a wavelength of 435 nm to 492 nm, green light is the visible light with a wavelength of 492 nm to 577 nm, and red light is the visible light with a wavelength of 610 nm to 770 nm. The light emission intensity of the visible light with different wavelengths at the large viewing angle is attenuated. Ideally, it is hoped that the visible light with different wavelengths has the same degree of attenuation at the same viewing angle. However, in fact, the visible light with different wavelengths has different degrees of attenuation. That is to say, the light of different colors has different degrees of attenuation, leading to the color cast locus shift and changes in the color coordinates and affecting the color cast of white light picture quality at the large viewing angle of the display panel and the visual effect of the user.

The applicant in this case provides a solution to the preceding problems through careful and in-depth research.

An embodiment of the present application provides a display panel. The display panel includes a base substrate, a light-emitting element layer, and a light-shielding component. The light-emitting element layer is located on a side of the base substrate and includes multiple light-emitting elements arranged in an array. The light-shielding component is located on a side of the light-emitting element layer facing away from the base substrate. An orthographic projection of the light-shielding component on the base substrate is located between orthographic projections of adjacent light-emitting elements on the base substrate. Different parts of the light-shielding component have different widths along a direction parallel to a plane where the display panel is located.

Figure 2:
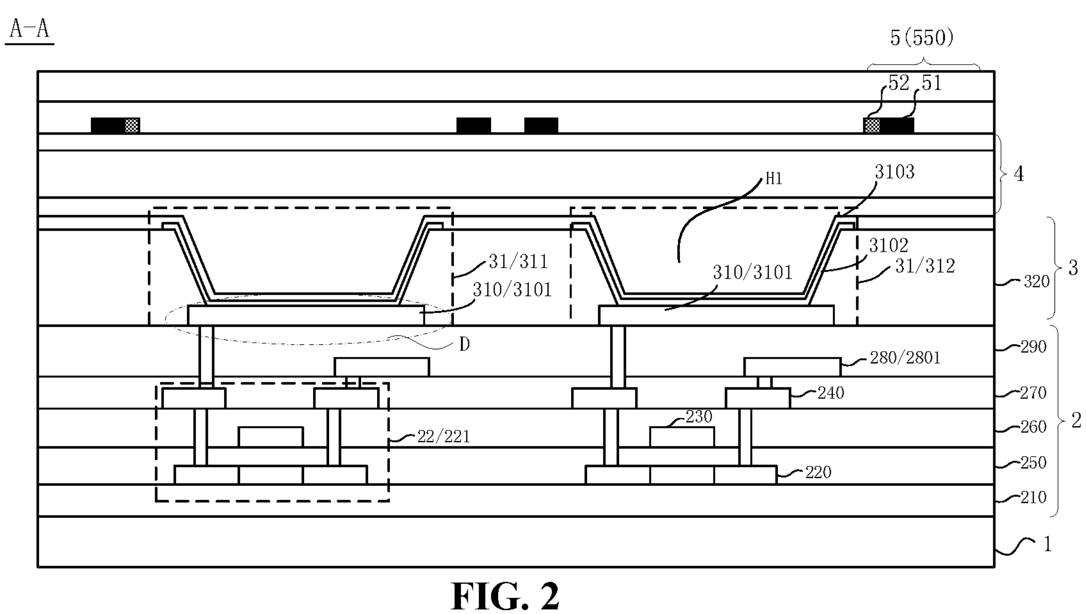
FIG. 2 is a partial section diagram taken along A-A of FIG. 1.

Referring to FIGS. 1 and 2, FIG. 1 is a top diagram of a display panel according to an embodiment of the present disclosure, FIG. 2 is a partial section diagram taken along A-A of FIG. 1, and the section is perpendicular to the plane where the display panel is located.

Optionally, a display panel 10 is divided into a display region and a non-display region surrounding the display region. It is to be understood that a dotted rounded frame in FIG. 1 is used for indicating the boundary between the display region and the non-display region. The display region is a region for the display panel to display the image and generally includes multiple pixels arranged in an array, and the pixels include corresponding light-emitting devices (for example, diodes) and control elements (for example, thin-film transistors that form a pixel driving circuit). The non-display region surrounds the display region and generally includes a peripheral drive element, a peripheral wire, and a fan-out region.

The display panel 10 provided in the embodiment of the present application includes a base substrate 1. A light-emitting element layer 3 is disposed on a side of the base substrate 1. A light-shielding component 5 is disposed on a side of the light-emitting element layer 3 facing away from the base substrate 1. Along a direction perpendicular to the display panel 10, a projection of the light-shielding component 5 on the base substrate 1 is located between projections of adjacent light-emitting elements 31 on the base substrate 1. That is to say, an orthographic projection of the light-shielding component 5 on the base substrate 1 does not overlap an orthographic projection of the light-emitting element 31 on the base substrate 1. In other words, along a direction perpendicular to a plane where the display panel 10 is located, the light-shielding component 5 is disposed at the interval around the light-emitting element 31. Different parts of at least one light-shielding component 5 have different widths along a direction parallel to the plane where the display panel 10 is located.

Figure 3:
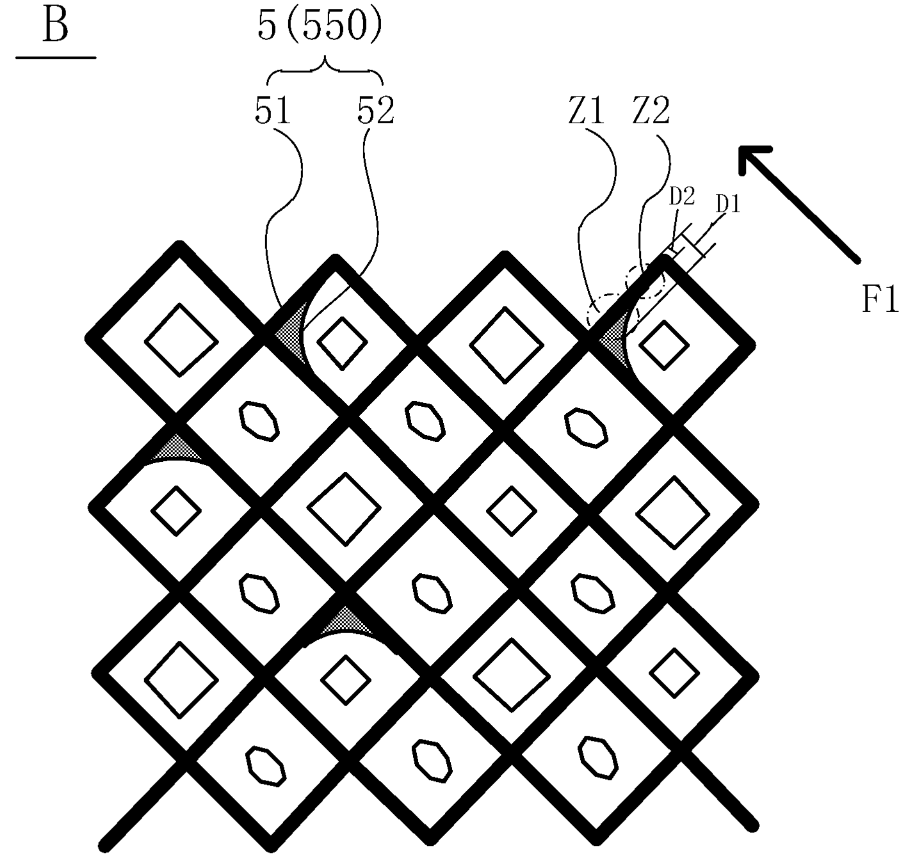
FIG. 3 is a partial enlarged top diagram of region B in FIG. 1.

For example, FIG. 3 is a partial enlarged top diagram of region B in FIG. 1. One light-shielding component 5 is used as an example. The light-shielding component 5 includes a first part Z1 and a second part Z2. Along a first direction F1, the width of the first part Z1 is D1, the width of the second part Z2 is D2, and the width D1 of the first part Z1 is greater than the width D2 of the second part Z2. It is to be understood that the number of light-shielding components 5 having different widths at different parts is not limited to 1 and may be, for example, 2, 3, 4, or the like, which is not specifically limited in this embodiment.

The display panel 10 may be the configuration used for actually generating the image. For example, the display panel 10 may be an organic light-emitting display panel, a quantum dot display layer panel, or a micro light-emitting diode (microLED) display panel. The display panel 10 includes a display region 101 and a non-display region 102 located at the periphery of the display region 101. In other embodiments, the display panel 10 may also include only the display region 101 without the non-display region 102, thereby implementing a full screen. The display panel 10 may include the base substrate 1, an array layer 2, the light-emitting element layer 3, and an encapsulation layer 4.

The base substrate 1 may include a synthetic resin film. The synthetic resin film may include thermosetting resin. The base substrate 1 may have a multilayer structure. For example, the base substrate 1 may have a three-layer structure of the synthetic resin film, an adhesive layer, and the synthetic resin film. In particular, the synthetic resin film may be a polyimide resin layer, and the material of the synthetic resin film is not limited. The synthetic resin film may include at least one of acrylic resin, methacrylic resin, polyisoprene, vinyl resin, epoxy resin, polyurethane resin, cellulose resin, siloxane resin, polyamide resin, or perylene resin. In addition, the base substrate 1 may include a glass substrate or an organic/inorganic composite substrate.

The array layer 2 may be disposed on the base substrate 1. The array layer 2 may include an insulating layer, a semiconductor pattern, a conductive pattern, and a signal line, for example, a buffer layer 210, an active layer 220, a first insulating layer 250, a gate layer 230, a second insulating layer 260, a source-drain layer 240, a third insulating layer 270, a signal line 280, and a fourth insulating layer 290. The insulating layers, the semiconductor layer, and the conductive layer may be formed on the base substrate 1 by methods such as coating or vapor deposition, and the insulating layers, the semiconductor layer, and the conductive layer may be selectively patterned by a photolithography process. Then, the semiconductor pattern, the conductive pattern, and the signal line included in the array layer 2 may be formed.

The light-emitting element layer 3 may be disposed in the display region 101 on a side of the array layer 2 facing away from the base substrate 1. The light-emitting element layer 3 may include multiple light-emitting elements 31 arranged in an array. For example, the light-emitting element layer 3 may include the organic light-emitting element, the quantum dot, the quantum rod, or the microLED.

The encapsulation layer 4 may be disposed on the light-emitting element layer 3. The encapsulation layer 4 may include an inorganic layer, an organic layer, and an inorganic layer that are sequentially stacked, but the layers constituting the encapsulation layer 4 are not limited thereto.

The inorganic layers protect the light-emitting element layer 3 from moisture and oxygen, and the organic layer protects the light-emitting element layer 3 from foreign substances such as dust particles. The inorganic layer may include a silicon nitride layer, a silicon oxynitride layer, a silicon oxide layer, a titanium oxide layer, or an aluminum oxide layer. The organic layer may include an acrylic organic layer, but the present application is not limited to this.

The light-emitting elements 31 may include a red light-emitting element, a green light-emitting element, and a blue light-emitting element. In the related art, three primary colors of red, green, and blue are generally used for the color-mixed display to present a full-color display. For example, red, green, blue, and white may also be used for display, which is not specifically limited in the present application. The light-emitting element 31 working under a high drive current is prone to aging, resulting in a phenomenon of large-viewing-angle color cast, seriously affecting the display effect. The inventor has found that the main reason for this problem is that the light emitted by the light-emitting element 31 in the display panel 10 generally includes the light emitted to the front viewing angle and the light emitted to the large viewing angle. It is to be understood that the viewing angle indicates the angle at which the user views the image. As the viewing angle increases, the brightness of the light emitted by different light-emitting elements 31 is attenuated at different rates, resulting in different brightness of the light emitted by different light-emitting elements at the large viewing angle. Optionally, during the color-mixed display of the three primary colors, the color-mixed ratio of the three primary colors is unbalanced, resulting in the white balance deviation at the large viewing angle, that is, the color cast of white light picture quality, affecting the display effect.

In the embodiment of the present application, the light-shielding component 5 is disposed on the side of the light-emitting element layer 3 facing away from the base substrate 1, the orthographic projection of the light-shielding component 5 on the base substrate 1 is located between the orthographic projections of adjacent light-emitting elements 31 on the base substrate 1, and different parts of at least one light-shielding component 5 have different widths along the direction parallel to the plane where the display panel 10 is located.

In the embodiment of the present application, the light-shielding component 5 is disposed on a large-viewing-angle light emission side of the light-emitting element 31 in the display panel 10 to control the light emitted at the large viewing angle, so as to match the attenuation rate of the light-emitting elements of different colors at the large viewing angle. That is to say, the light-shielding component 5 is disposed between adjacent light-emitting elements 31 and does not overlap the light-emitting elements 31 so that the light emission efficiency of the light-emitting elements 31 at the front viewing angle is not affected. Moreover, for the light-emitting element 31 with a relatively small amount of attenuation at the large viewing angle, at a light emission position in the large viewing angle, the light-shielding component 5 is disposed at the interval around the light-emitting element 31 so that the light emission intensity of the light-emitting element 31 at the large viewing angle is reduced. Specifically, in the embodiment of the present application, the width of at least part of the light-shielding component 5 along a certain direction is greater than the width of other parts of the light-shielding component 5, so as to balance the light emission of the display panel 10 and the display device at the large viewing angle in this direction, improve the phenomenon of the large-viewing-angle color cast of the display panel 10 and the display device, and improve the display effect of the display panel 10 and the display device.

For example, the light-shielding component in the display panel includes a first light-shielding component and a second light-shielding component, where at least part of the first light-shielding component has the same width along the direction parallel to the plane where the display panel is located, and the second light-shielding component is located on a side of the first light-shielding component facing a light-emitting element of the light-emitting elements.

Figures 4, 5:
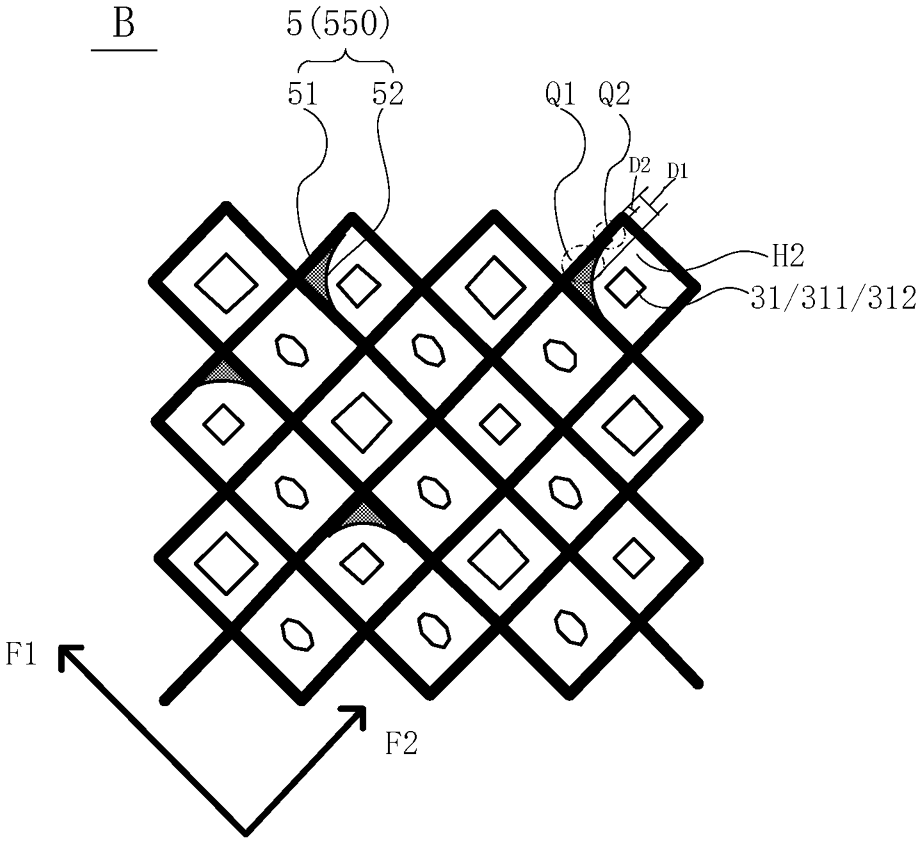
FIG. 4 is another partial enlarged top diagram of region B in FIG. 1.
FIG. 5 is a partial enlarged section diagram of a light-emitting element.

FIG. 4 is another partial enlarged top diagram of region B in FIG. 1. The light-shielding component 5 in the display panel 10 provided in the embodiment of the present application includes a first light-shielding component 51 and a second light-shielding component 52. At least part of the first light-shielding component 51 has the same width along the first direction F1 or a second direction F2. That is to say, as shown in the figure, the first light-shielding component 51 includes at least two parts. For example, along the first direction F1, the width of the first light-shielding component 51 located in a first region Q1 is D2, and the width of the first light-shielding component 51 located in a second region Q2 is also D2, that is, the width of the first light-shielding component 51 located in the first region Q1 is equal to the width of the first light-shielding component 51 located in the second region Q2. The second light-shielding component 52 is located on a side of the first light-shielding component 51 facing the light-emitting element 31.

In other words, since the second light-shielding component 52 of the light-shielding component 5 is added in the first region Q1, the width of the light-shielding component 5 in the first region Q1 is greater than the width of the light-shielding component 5 in the second region Q2 along the first direction F1. Moreover, the second light-shielding component 52 is located on a side of the first light-shielding component 51 facing the corresponding light-emitting element 31 to block the light of the light-emitting element 31 at the large viewing angle.

That is to say, the first light-shielding component 51 is equivalent to a metal strip having a uniform width within an error range. The metal strip is located between two adjacent light-emitting elements 31 (referring to the orthographic projection positional relationship in the plane where the display panel is located), the extension direction of the metal strip intersects with the direction of the connecting line between the light-emitting elements on two sides of the metal strip, and the width direction of the metal strip is parallel to the direction of the connecting line between the light-emitting elements on two sides of the metal strip, that is, being equivalent to D2 in some embodiments. The second light-shielding component 52 is equivalent to part of the light-shielding component 5 extending from the first light-shielding component 51 toward the light-emitting elements 31.

In the embodiment of the present application, the second light-shielding component is provided to widen the first light-shielding component, thereby improving the effect of the light-shielding component blocking the light of the light-emitting element at the large viewing angle.

Optionally, the second light-shielding component 52 is in the same layer as the first light-shielding component 51 and is made of the same material as the first light-shielding component 51. That is to say, the second light-shielding component 52 and the first light-shielding component 51 may be completed in the same manufacturing process and integrally formed.

Of course, in other optional embodiments of the present application, the second light-shielding component 52 and the first light-shielding component 51 may be in different layers.

Optionally, the second light-shielding component 52 is additionally disposed in any film layer of the light-emitting element layer 3 facing a light emission side of the display panel 10.

Of course, in other optional embodiments of the present application, any metal layer among film layers of the light-emitting element layer 3 facing the light emission side of the display panel 10 is reused as the second light-shielding component 52.

With continued reference to FIG. 2, in other optional embodiments of the present application, the display panel 10 includes a black matrix and/or a touch electrode, where any one or two of the black matrix or the touch electrode may be reused as the first light-shielding component or the second light-shielding component.

Optionally, the display panel further includes a touch function layer.

Optionally, the touch function layer is located on the encapsulation layer 4 of the display panel 10, that is to say, the touch function layer is located on a side of the encapsulation layer facing away from the light-emitting elements.

Optionally, a film layer in the touch function layer is reused as the light-shielding component 5 (or any one of the second light-shielding component 52 or the first light-shielding component 51). That is to say, the light-shielding component 5 is of the same layer and material as one or more film layers in the touch function layer.

Specifically, the touch function layer includes the touch electrode, and the first light-shielding component or the second light-shielding component is in the same layer as the touch electrode and is made of the same material as the touch electrode.

Of course, in other optional embodiments of the present application, the touch function layer may further include a bridge layer, where the bridge layer and the touch electrode may be in different layers, the bridge layer is used for connecting two touch electrode blocks in the same electrode channel, and the first light-shielding component or the second light-shielding component is in the same layer as the bridge layer and is made of the same material as the bridge layer.

Optionally, the touch function layer includes a metal grid 550, and the meshes of the metal grid are arranged corresponding to the light-emitting elements. Optionally, the metal grid 550 forms the touch electrode. In terms of touch control, the metal grid has the advantages such as low impedance (less than 10 ohms) and high flexibility and is used for achieving a flexible display panel and improving bending reliability.

Optionally, the light-shielding component 5 or any one of the second light-shielding component 52 or the first light-shielding component 51 is in the same layer as the metal grid 550 and is made of the same material as the metal grid 550. That is to say, the second light-shielding component 52 or the first light-shielding component 51 is also made of metal material.

Optionally, the metal grid 550 includes metal wires (or called grid lines) intersecting with each other. The grid may be described below.

Optionally, the metal wires are arranged at the intervals between the light-emitting elements, and the metal wires are arranged around the pixels or the light-emitting elements and do not block the light emitted by the light-emitting elements at the front viewing angle.

Through the preceding embodiments, the manufacturing process can be simplified, and the light of a specific viewing angle that needs to be improved can be better selected in terms of the distance through the position of the preceding structure.

Of course, in other optional embodiments of the present application, the display panel further includes a color filter layer, where the color filter layer includes the black matrix, and the black matrix is arranged at the interval between the light-emitting elements, is arranged around the pixel or the light-emitting element, and does not block the light emitted by the light-emitting element at the front viewing angle. The black matrix includes light-shielding lines (or called grid lines) intersecting with each other, the meshes of the grid lines are arranged corresponding to the light-emitting elements, and a color resistance is disposed in the mesh.

Optionally, the light-shielding component or any one of the second light-shielding component or the first light-shielding component is in the same layer as the black matrix as the black matrix and is made of the same material as the black matrix. That is to say, the second light-shielding component or the first light-shielding component is also made of non-metallic material.

Of course, in other optional embodiments of the present application, the display panel may include the touch function layer and the color filter layer at the same time. The touch function layer and the color filter layer may be sequentially stacked on a thin film encapsulation layer.

Through the preceding embodiments, the manufacturing process can be simplified, and the light of a specific viewing angle that needs to be improved can be better selected in terms of the distance through the position of the preceding structure.

Of course, in some optional embodiments of the present application, the second light-shielding component and the first light-shielding component may be located in different layers. For example, the first light-shielding component is located in the film layer where the touch electrode is located, and the second light-shielding component is located in the film layer where the black matrix is located. In this case, optionally, the orthographic projections of the second light-shielding component and the first light-shielding component on the plane where the display panel is located at least partially overlap.

In some optional embodiments of the present application, the display panel includes the array layer located between the base substrate and the light-emitting element layer and the array layer includes multiple circuit elements and signal lines connecting the multiple circuit elements, where the signal lines include a first signal line.

The light-emitting elements include at least one first light-emitting element, and a first light-emitting element of the at least one first light-emitting element includes an anode; where the anode of the first light-emitting element includes a first part anode and a second part anode, the first part anode overlaps with an orthographic projection of the first signal line on the base substrate, the second part anode does not overlap with the orthographic projection of the first signal line on the base substrate, and the second light-shielding component is located between the second part anode and the first light-shielding component.

Referring to FIGS. 2 and 5, FIG. 5 is a partial enlarged section diagram of a light-emitting element. The display panel 10 provided in the present application includes the array layer 2 located between the base substrate 1 and the light-emitting element layer 3. And the array layer 2 includes multiple circuit elements 221 and signal lines 280 connecting the circuit elements 221. Specifically, the array layer 2 may include multiple pixel driving circuits 22. The specific implementation of the pixel driving circuits 22 may be set by those skilled in the art according to the actual situation and is not limited here. For example, the pixel driving circuit includes "8T1C", "7T1C", "2T1C", and other circuit elements, where "T" represents a thin-film transistor, and "C" represents a capacitor. The signal lines 280 include first signal lines 2801. For example, the first signal lines 2801 are power signal lines PVDD and are arranged in an array in the array layer 2 below the light-emitting element layer 3 to provide power signals to the light-emitting elements 31. The array layer 2 further includes an insulating layer. The insulating layer covers the pixel driving circuits 22 and the signal lines 280. On the one hand, the insulating layer isolates the erosion of the circuit elements 221 by water and oxygen, and on the other hand, the insulating layer provides a flat surface to the light-emitting elements 31. An anode layer 310 is disposed above the array layer 2, that is, the anode layer 310 is formed on the flat surface formed by the insulating layer in the array layer 2. A pixel defining layer 320 is disposed above the anode layer 310 and has an opening H1, and the opening H1 exposes an anode 3101 of the light-emitting element 31. The light-emitting elements 31 include at least one first light-emitting element 311, and the first light-emitting element 311 includes the anode 3101. The anode 3101 of the first light-emitting element 311 includes a first part anode 3101-1 and a second part anode 3101-2. The first part anode 3101-1 overlaps an orthographic projection of the first signal line 2801 on the base substrate 1, and the second part anode 3101-2 does not overlap the orthographic projection of the first signal line 2801 on the base substrate 1. The second light-shielding component 52 is located between the second part anode 3101-2 and the first light-shielding component 51.

In the embodiment of the present application, the inventor has found through research that there is a difference in flatness between the surface of the insulating layer overlapping the signal line 280 and the surface of the insulating layer not overlapping the signal line 280. This is because, in some embodiments, the signal line 280 is made of metal with a certain thickness and hardness so that the planarization degree of the surface of the insulating layer covering the signal line 280 and the planarization degree of the surface of the insulating layer not covering the signal line 280 are different. Specifically, the part of the insulating layer overlapping the signal line 280 is thicker than the part of the insulating layer not overlapping the signal line 280. Further, a slope with an inclined angle is generated at the junction of the two parts of the insulating layer.

In some embodiments, the display panel 10 includes the first light-emitting element 311, and the signal line 280 includes the first signal line 2801. For example, the first signal line 2801 may be the power signal line PVDD, which is not specifically limited in the present application. Referring to FIG. 5, the anode 3101 of the first light-emitting element 311 is formed in this boundary region so that the second part anode 3101-2 not overlapping the signal line 280 forms a slope relative to the first part anode 3101-1 overlapping the first signal line 2801. Therefore, the second part anode 3101-2 not overlapping the power signal line PVDD forms a slope relative to the first part anode 3101-1 overlapping the first signal line 2801. In other words, the second part anode 3101-2 not supported by the first signal line 2801 forms a slope relative to the first part anode 3101-1 supported by the first signal line 2801.

The first part anode 3101-1, a light-emitting layer 3102, and a cathode 3103 work together to emit the first light RE1, and the second part anode 3101-2, the light-emitting layer 3102, and the cathode 3103 work together to emit the second light RE2. Due to the slope formed by the first part anode 3101-1 and the second part anode 3101-2, in this case, when the human eyes are at the position of the front viewing angle to watch the light emitted by the first light-emitting element 311, the first light RE1 emitted from the position of the first part anode 3101-1 at the front viewing angle is perpendicular to the surface of the first part anode 3101-1, that is, the first light RE1 does not have an angle of inclination, and the second light RE2 emitted at the position of the second part anode 3101-2 at the front viewing angle has a certain angle of inclination to the light emitted perpendicular to the surface of the second part anode 3101-2. That is to say, when the human eyes are at the front viewing angle, the second light RE2 emitted at the front viewing angle actually has a certain angle of inclination. When the human eyes are at the large viewing angle to watch the light emitted by the first light-emitting element 311, the first light RET emitted from the position of the first part anode 3101-1 at the large viewing angle has a certain angle of inclination to the light emitted perpendicular to the surface of the first part anode 3101-1. That is to say, in this case, the first light RET has a certain angle of inclination, and the second light RE2 emitted from the position of the second part anode 3101-2 at the large viewing angle is perpendicular to the surface of the second part anode 3101-2, that is, the second light RE2 does not have an angle of inclination.

Figure 6:
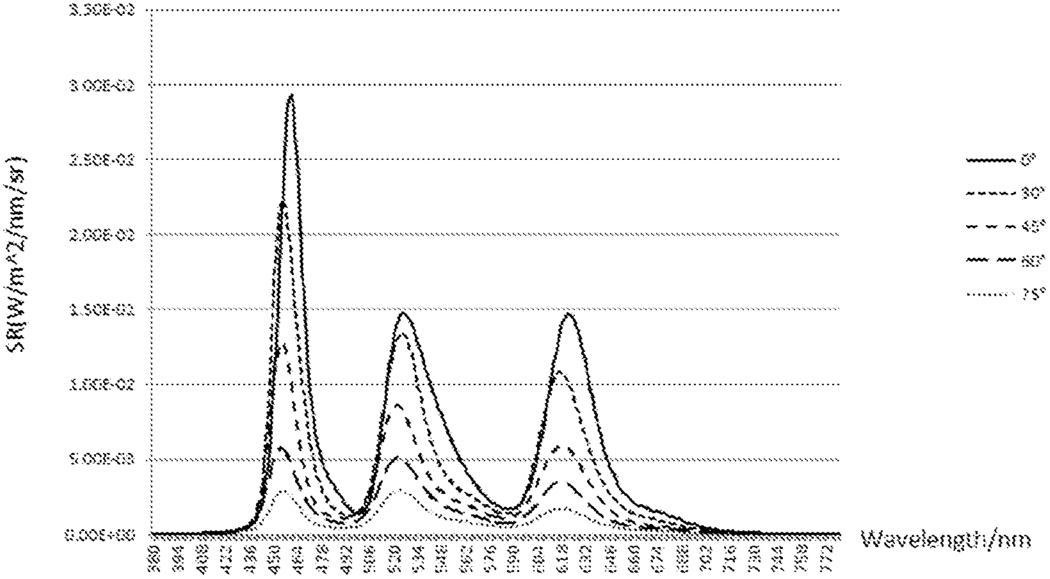
FIG. 6 shows the variation of the light emission spectrum of a display panel with a viewing angle obtained by the inventor after a study.

For the preceding problem, the inventor carefully studied and found that the light-emitting elements may include the light-emitting elements emitting blue light, green light, or red light. Specifically, blue light is the visible light with a wavelength of 435 nm to 492 nm, green light is the visible light with a wavelength of 492 nm to 577 nm, and red light is the visible light with a wavelength of 610 nm to 770 nm. Referring to FIG. 6, FIG. 6 shows the variation of the light emission spectrum of a display panel with a viewing angle obtained by the inventor after a study. As can be seen from FIG. 6, the light emission intensity of the visible light with different wavelengths at the large viewing angle is attenuated. Ideally, it is hoped that the visible light with different wavelengths has the same degree of attenuation at the same viewing angle. However, in fact, the visible light with different wavelengths has different degrees of attenuation. That is to say, the light of different colors has different degrees of attenuation when the light deviation angles are different, leading to the color cast locus shift and changes in the color coordinates and affecting the color cast of white light picture quality at the large viewing angle of the display panel and the visual effect of the user.

In the preceding analysis of the embodiment of the present application, among the first light RET and the second light RE2 observed at the front viewing angle, the first light RET does not have an angle of inclination, and the second light RE2 has a certain angle of inclination. The inclination mentioned here refers to the light emission direction of the second light RE2 relative to an anode surface at a light emission point. Referring to FIG. 6, that is, the second light RE2 is not parallel to a dashed line starting from the same starting point as the second light RE2 in FIG. 6. In this case, the light intensity at the side of the first part anode 3101-1 is greater than the light intensity at the side of the second part anode 3101-2. At the large viewing angle, the first light RET has a certain angle of inclination, and the second light RE2 does not have an angle of inclination. With continued reference to FIG. 6, in this case, the light intensity at the side of the second part anode 3101-2 is greater than the light intensity at the side of the first part anode 3101-1, eventually resulting in asymmetric attenuation of light intensities of the first light-emitting element 311 with the different viewing angles, causing the asymmetric degrees of the color cast of the light-emitting element 311 with the different viewing angles, and affecting the display effect.

In the embodiment of the present application, the second light-shielding component 52 is disposed in the light emission direction at the side of the second part anode 3101-2 of the first light-emitting element 311, so as to increase the line width of the light-shielding component 5 in the light emission direction at the side of the second part anode 3101-2, block the light emission amount of the second light RE2 emitted at the position of the second part anode 3101-2 at the large viewing angle when the human eyes are at the position of the large viewing angle, weaken the overall light intensity of the second light RE2, and balance the light intensity of the second light RE2 and the light intensity of the first light RET at the large viewing angle so that the light emission intensity of the first light-emitting element 311 is attenuated with the viewing angle approximately the same in all directions, thereby compensating the difference of the light emitted from the anode in different situations and improving the display effect.

Further, the first light-emitting element 311 in the display panel is the blue light-emitting element.

Referring to FIG. 6, different colors of light have different wavelengths, and the light with high energy is more likely to cause the decay of the luminescent material in the light-emitting layer in the light-emitting element so that the light-emitting elements emitting the light with high energy are more likely to decay. For example, the blue light emitted by the blue light-emitting element is the visible light with the highest energy close to the ultraviolet light region and generally has a wavelength of 435 nm to 492 nm. The blue light has a smaller wavelength and higher energy than the red light and green light. Therefore, during the light emission process, the luminescent material of the blue light-emitting element is more likely to decay, and the luminescent materials of the green light-emitting element and the red light-emitting element decay relatively slowly. Therefore, during the color-mixed display, the proportion of the blue light decreases, and the proportion of the green light or red light increases relatively, resulting in the uncoordinated light mixing ratio of the three primary colors and causing white light color cast. It is to be noted that according to different structures of the display panel, in other possible embodiments, the attenuation rate of the luminescent material in the light-emitting element of another color may be greater than the attenuation rate of the luminescent material in the blue light-emitting element, causing the color cast, which is not specifically limited in the present application.

In addition, through the microcavity effect, the light emitted by each light-emitting element is repeatedly reflected, re-reflected, amplified, and constructively interfered between the anode and the cathode, the brightness of the light is increased, and the color cast is further amplified. Therefore, as an embodiment, the light emission area of the light-emitting element emitting the blue light is greater than the light emission area of the light-emitting element emitting the red light or green light. In this manner, the poor display caused by different attenuation rates of the luminescent materials emitting different colors of light can be alleviated to a certain extent.

Further, due to the relatively large area of the blue light-emitting element 31, the blue light-emitting element 31 is more likely to overlap the first signal line 2801 along a direction perpendicular to the plane where the display panel 10 is located, and the length of the blue light-emitting element 31 is greater than the length of the first signal line 2801 along at least one direction. That is to say, the first signal line 2801 only partially overlaps the blue light-emitting element 31. Further, the first signal line 2801 only overlaps part of the anode 3101 of the blue light-emitting element 31. Therefore, the anode 3101 of the blue light-emitting element 31 is uneven due to the existence of the first signal line 2801, resulting in asymmetrical attenuation of the light emission intensity of the blue light-emitting element 31 in different directions with different viewing angles, causing different degrees of the color cast of the display panel 10 at different viewing angles and affecting the display effect.

To solve the preceding problems, in the embodiment of the present application, for the first light-emitting element 311, that is, the blue light-emitting element 31, the second light-shielding component 52 is disposed at the large-viewing-angle light emission side of the second part anode 3101-2 of the first light-emitting element 311. In this manner, the width of the light-shielding component 5 is increased, the light emission intensity at the light emission side of the second part anode 3101-2 at the large viewing angle is reduced, the light emission intensity at the light emission side of the second part anode 3101-2 and the light emission intensity at the light emission side of the first part anode 3101-1 are more balanced, the asymmetric attenuation of the light emission intensities of the first light-emitting element 311 (that is, the blue light-emitting element 31) in different directions with different viewing angles is improved, the visual effect of the user is improved, and the user experience is improved.

In some other optional embodiments of the present application, at least part of the light-shielding component adjacent to a light-emitting element of a first color has a width of D1, and at least part of the light-shielding component not adjacent to the light-emitting element of the first color has a width of D2, where D1>D2.

Referring to FIGS. 2 and 4, the light-emitting elements 31 include a light-emitting element of the first color 312. The light-shielding component 5 is disposed on a side of the light-emitting element of the first color 312 facing a light emission surface of the display panel 10. Along the direction perpendicular to the plane where the display panel 10 is located, a projection of an airtight area surrounded by the light-shielding component 5 on the base substrate 1 covers a projection of the light-emitting element of the first color 312 on the base substrate 1. The light-shielding component includes the first light-shielding component 51 and the second light-shielding component 52, and the second light-shielding component 52 is disposed between the first light-shielding component 51 and the light-emitting element of the first color 312. In other words, at least part of the light-shielding component 5 adjacent to the light-emitting element of the first color 312 has a width of D1, that is to say, the second light-shielding component 52 is adjacent to the light-emitting element of the first color 312, and the first light-shielding component 51 is separated from the light-emitting element of the first color 312 by the second light-shielding component 52, that is, the light-shielding component 5 includes the first light-shielding component 51 and the second light-shielding component 52, at least part of the light-shielding component 5 adjacent to the light-emitting element of the first color 312 has a width of D1, and at least part of the light-shielding component 5 not adjacent to the light-emitting element of the first color 312 has a width of D2, where D1>D2.

In the embodiment of the present application, the width of the light-shielding component 5 is set, so as to adjust the light emission intensity of the light-emitting element of the first color 312 at the large viewing angle, balance the mixing ratio of the three primary colors at the large viewing angle, alleviate the color cast of the display panel 10, and further improve the display effect of the display panel 10.

The first color is green. It should be pointed out that in the embodiment of the present application, optionally, the first color is green; in the display panel 10 provided in the embodiment of the present application, the light emission intensity attenuation of the green light-emitting element at the large viewing angle is the least; therefore, the overall color cast locus of the display panel at the large viewing angle shifts toward green, affecting the color cast of white light picture quality of the display panel 10 at the large viewing angle and affecting the visual effect of the user. In the embodiment of the present application, the width of the light-shielding component 5 is set, so as to adjust the light emission intensity of the light-emitting element of the first color 312 (that is, the green light-emitting element 31) at the large viewing angle, balance the mixing ratio of the three primary colors at the large viewing angle, alleviate the color cast of the display panel 10, and further improve the display effect of the display panel 10.

It is to be noted that according to different structures of the display panel, in other possible embodiments, the color cast of another color may be greater than the color cast of the green light-emitting element. In this case, the first color may also be another color, which is not specifically limited in this embodiment.

In some optional embodiments of the present application, the first light-shielding component is linear (or in the shape of a strip similar to the metal strip mentioned above), multiple first light-shielding components extending along the first direction and the second direction intersect to form a mesh structure, and a mesh of meshes in the mesh structure correspond to one light-emitting element of the light-emitting elements, where the first direction intersects with the second direction.

Referring to FIGS. 2 and 4, the first light-shielding component 51 is linear, and multiple criss-cross first light-shielding components 51 extending along the first direction F1 and the second direction F2 intersect to form the mesh structure. Meshes H2 of the mesh structure correspond to the light-emitting elements 31, that is to say, the meshes H2 formed by the first light-shielding components 51 are in a corresponding relationship with the light-emitting elements 31, that is, along the direction perpendicular to the plane where the display panel 10 is located, a projection of the mesh H2 formed by the intersection of the first light-shielding components 51 on the base substrate 1 at least partially overlap a projection of a corresponding light-emitting element 31 on the base substrate 1. The first direction F1 intersects with the second direction F2.

Optionally, the touch electrode is reused as the first light-shielding component 51, and the touch electrode is the metal grid 550; or the black matrix is reused as the first light-shielding component.

It is to be noted that the following content may be understood in conjunction with the preceding embodiment in which the touch electrode or the black matrix is reused if there is no contradiction.

Optionally, the mesh includes at least one corner, where the at least one corner includes a first corner; the first corner is a corner in the same mesh and is at a side of the same mesh facing away from the center of the display panel; and the second light-shielding component is located on a side of the first corner facing the corresponding light-emitting element.

Figure 7:
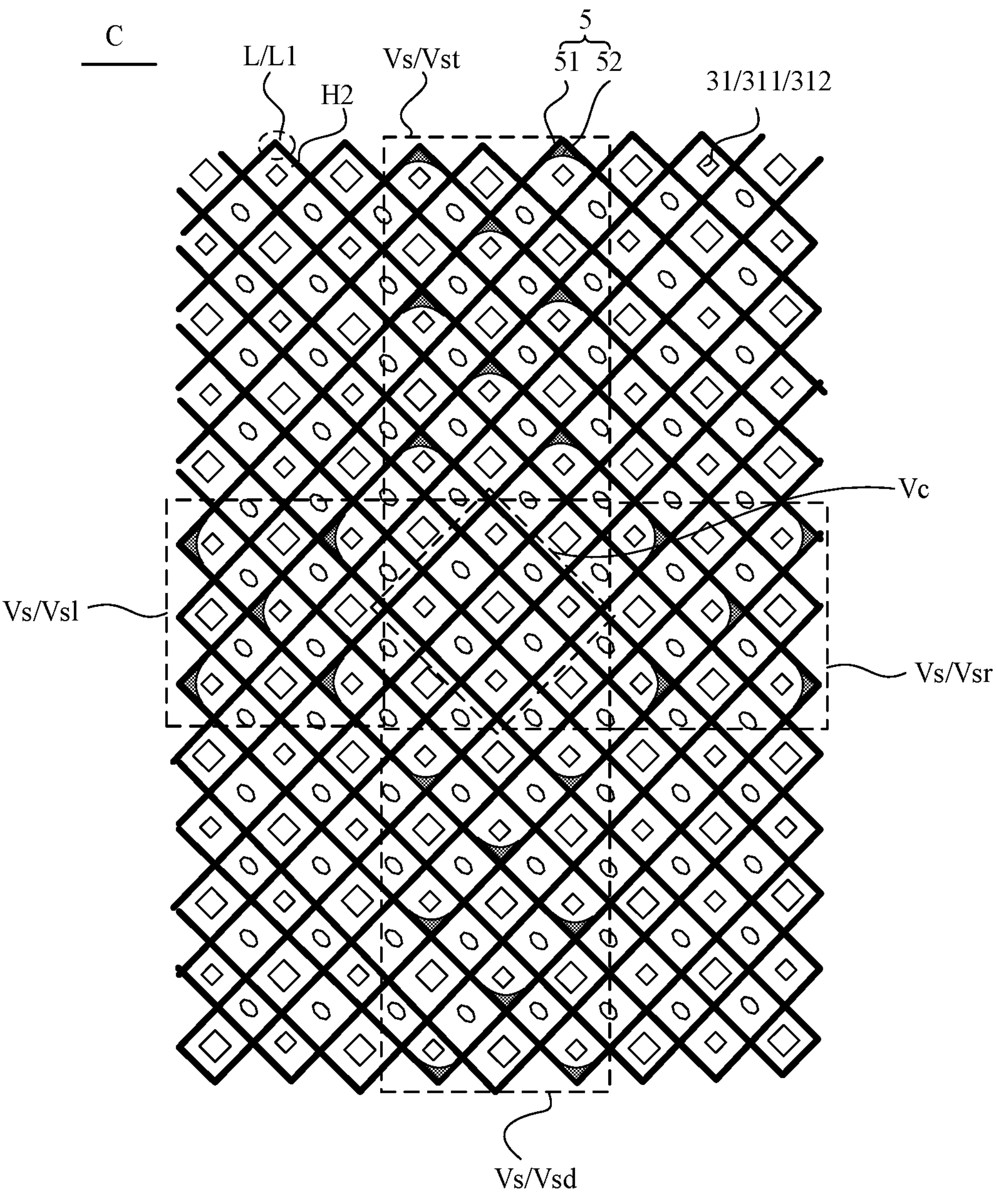
FIG. 7 is a partial enlarged top diagram of region C in FIG. 1.

Referring to FIG. 7, FIG. 7 is a partial enlarged top diagram of region C in FIG. 1. Each of the meshes H2 formed by the intersection of the first light-shielding components 51 includes at least one corner L. In this embodiment, the case where the mesh H2 includes four corners L is used as an example for description. It is to be understood that the example mesh H2 may include one, two, or three corners L, which is not specifically limited in the embodiment of the present application. The at least one corner L includes a first corner L1. The first corner L1 is the corner L at a side of the corresponding same mesh H2 facing away from the center of the display panel 10. In other words, the first light-shielding components 51 intersect to form the mesh H2 at least partially surrounding the corresponding light-emitting element 31, and the mesh H2 forms the at least one corner L at the intersection of the first light-shielding components 51. In the embodiment of the present application, the first corner L1 is located on a side of the corresponding light-emitting element 31 facing away from the center of the display panel 10, and the second light-shielding component 52 is located on a side of the first corner L1 facing the corresponding light-emitting element 31.

For a large display panel, since the display area of the display panel 10 is too large, the display panel 10 may be divided into different viewing regions. The different viewing regions may be understood as that the display panel 10 is divided into a central region Vc and edge regions Vs surrounding the central region Vc. Each region represents a viewing region, that is to say, a person may watch the display picture at different positions of the display panel 10. When the person watches the display picture at a position deviated from the central region Vc of the display panel 10, for example, when the person watches the display picture in the edge region Vs of the display panel 10, the viewing angle of the human eyes relative to the light-emitting elements 31 in the edge region Vs of the display panel 10 may be understood as 0°, and the viewing angle of the human eyes relative to the light-emitting elements 31 in the central region Vc of the display panel 10 is a certain angle of inclination.

That is to say, for a large-area display panel, as the viewing position of the user is uncertain, the central region of the display panel also has the problem of emitting light from the large viewing angle.

In the embodiment of the present application, the second light-shielding component 52 is provided for the light-emitting element 31 with a low attenuation rate of the luminescent material at the large viewing angle. Specifically, along a direction from the center of the display panel 10 to the edge of the display panel 10, the second light-shielding component 52 is disposed at the first corner on a side of the light-emitting element facing away from the central region of the display panel so that the light-shielding component 5 is wider there, the light emission amount of the light-emitting element 31 with a low attenuation rate of the luminescent material from the center of the display panel 10 to the edge of the display panel 10 is reduced, the attenuation of the light intensity of the light-emitting element 31 with a low attenuation rate of the luminescent material at the large viewing angle is accelerated, and the color-mixed ratio of the three primary colors is balanced, thereby improving the color cast of white light picture quality when the human eyes are located at different positions of the display panel. It is to be understood that in the embodiment of the present application, when the human eyes are located in the edge region Vs of the display panel 10 to watch the display picture, the light intensity of the light-emitting element 31 in the central region Vc relative to the human eyes is the light intensity at the large viewing angle.

It is to be noted that in the embodiment of the present application, A being located at a certain position refers to the range of positions where A is located. For example, the human eyes being located at a certain position refers to the range of positions where the orthographic projection of the human eyes on the display panel 10 along the direction perpendicular to the plane where the display panel 10 is located is located.

The center of the display panel 10 may be the geometric center of the display panel 10 or may be the center of gravity, the center, or the centroid of the display panel 10, which is not specifically limited in the embodiment of the present application.

Of course, in some other optional embodiments of the present application, the central region Vc may be a region the human eyes directly face, a main viewing region of the user (human eyes), or a region the eyes of the user face during the normal use of the display panel.

Optionally, the mesh includes at least one corner, where the at least one corner includes a second corner; the second corner is a corner in the same mesh and is at a side of the same mesh adjacent to the center of the display panel; and the second light-shielding component is located on a side of the second corner facing the corresponding light-emitting element.

Figure 8:
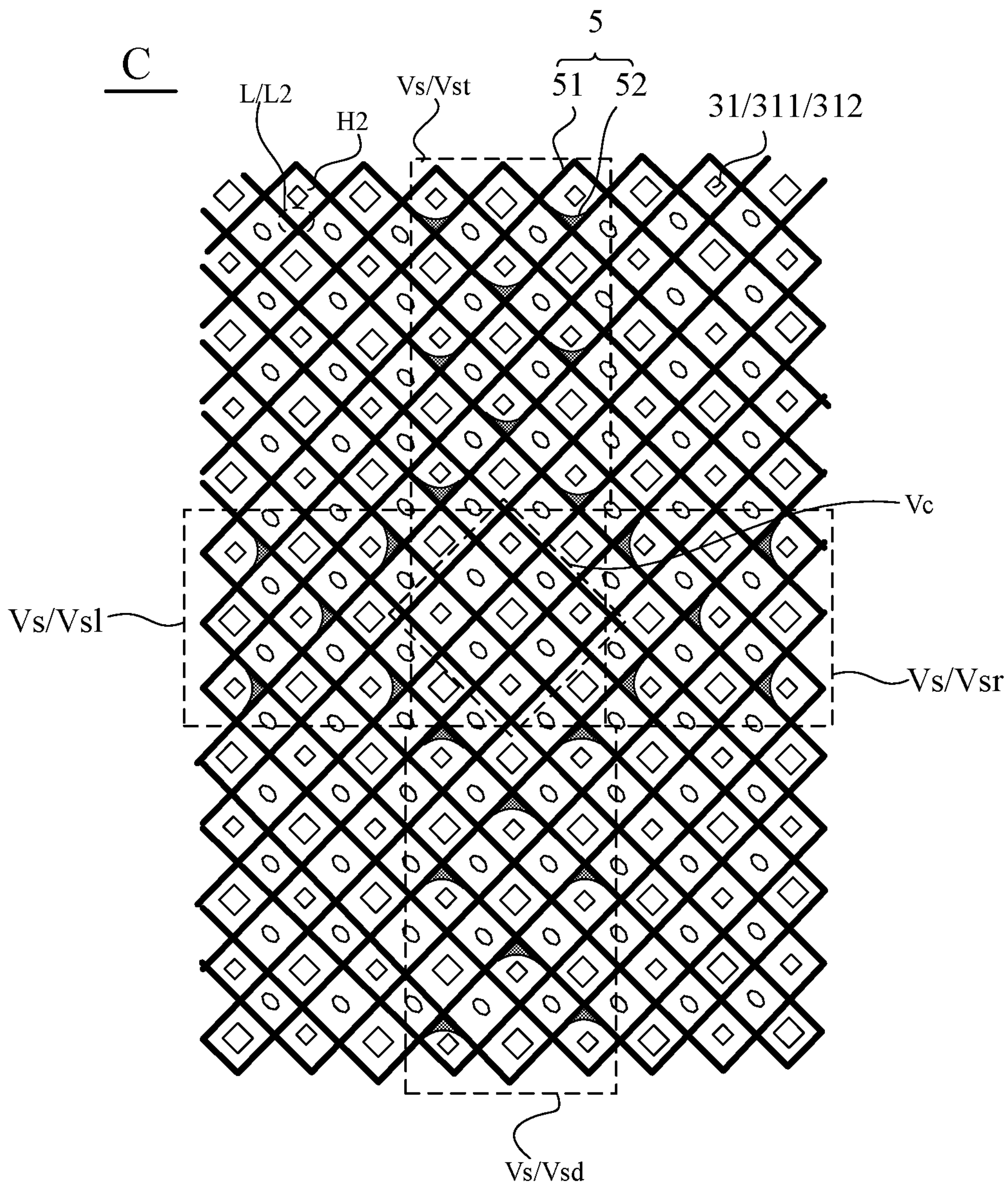
FIG. 8 is another partial enlarged top diagram of region C in FIG. 1.

Referring to FIG. 8, FIG. 8 is another partial enlarged top diagram of region C in FIG. 1. Multiple criss-cross first light-shielding components 51 intersect to form the meshes H2, the mesh H2 forms the corner L at the intersection of the first light-shielding components 51, and the mesh H2 includes at least one corner L. In the embodiment of the present application, the case where the mesh H2 includes four corners L is used as an example for description. It is to be understood that the example mesh H2 may include one, two, or three corners L, which is not specifically limited in the embodiment of the present application. The at least one corner L includes a second corner L2. The second corner L2 is the corner L at a side of the corresponding same mesh H2 adjacent to the center of the display panel 10. In other words, the first light-shielding components 51 intersect to form the mesh H2 at least partially surrounding the corresponding light-emitting element 31, and the mesh H2 forms the corner L at the intersection of the first light-shielding components 51. In the embodiment of the present application, the second corner L2 is located on a side of the corresponding light-emitting element 31 adjacent to the center of the display panel 10, and the second light-shielding component 52 is located on a side of the second corner L2 facing the corresponding light-emitting element 31.

In the embodiment of the present application, the second light-shielding component 52 is provided for the light-emitting element 31 with a low attenuation rate of the luminescent material at the large viewing angle. Specifically, along the direction from the center of the display panel 10 to the edge of the display panel 10, the second light-shielding component 52 is disposed at the second corner on a side of the light-emitting element facing the central region of the display panel so that the light-shielding component 5 is wider at this position, the light emission amount of the light-emitting element 31 with a low attenuation rate of the luminescent material from the edge of the display panel 10 to the center of the display panel 10 is reduced, the attenuation of the light intensity of the light-emitting element 31 with a low attenuation rate of the luminescent material at the large viewing angle is accelerated, and the color-mixed ratio of the three primary colors is balanced, thereby improving the color cast of white light picture quality.

In some optional embodiments of the present application, the mesh includes multiple corners, and at least part of the multiple corners are located on a side of the light-emitting element corresponding to the mesh facing a third direction F3; the second light-shielding component is located on a side of one of the at least part of the multiple corners; and the third direction F3 is parallel to a long side of the display panel.

Figure 9:
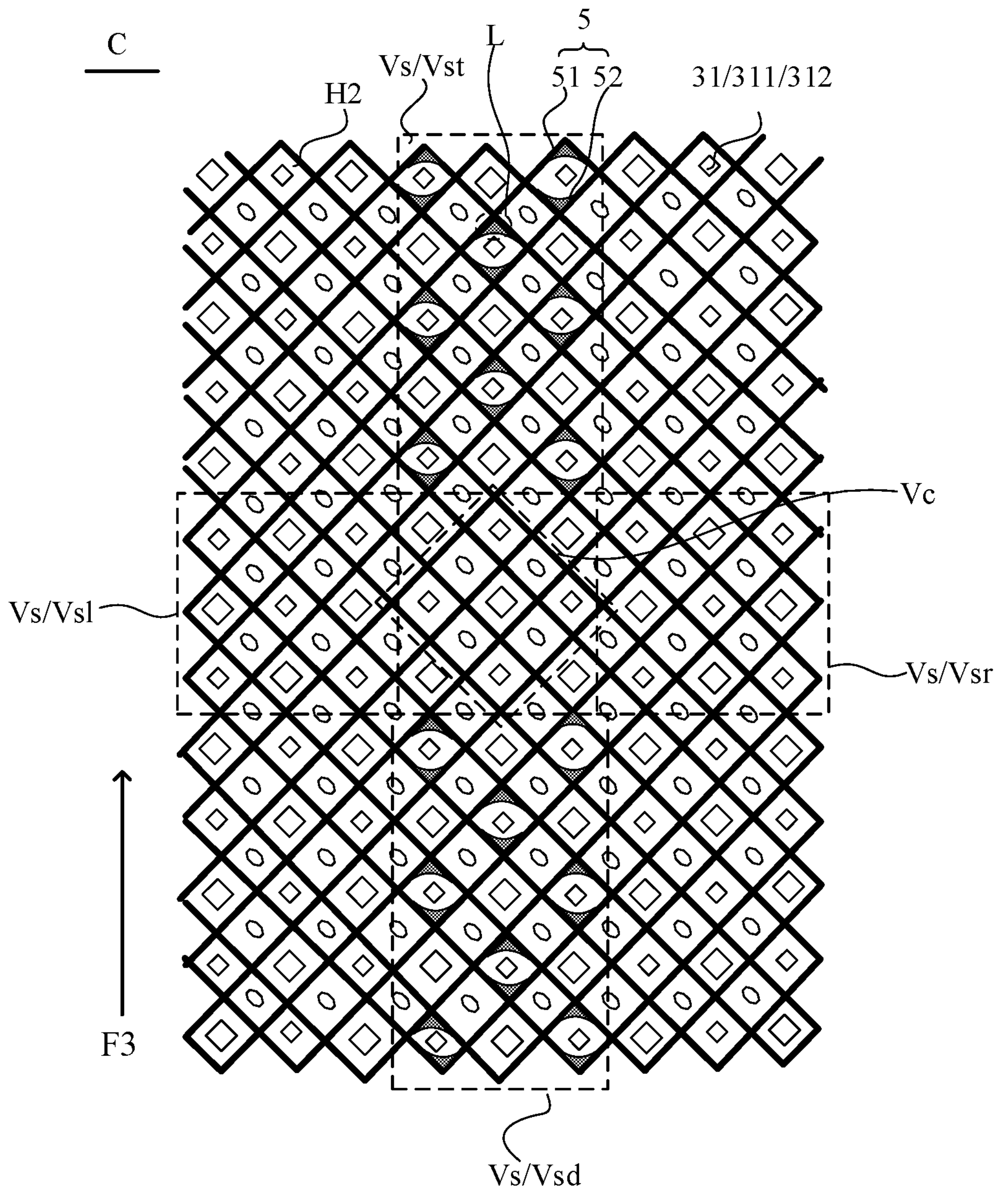
FIG. 9 is another partial enlarged top diagram of region C in FIG. 1.

Referring to FIG. 9, FIG. 9 is another partial enlarged top diagram of region C in FIG. 1. Multiple criss-cross first light-shielding components 51 intersect to form the meshes, the mesh forms the corner at the intersection of the first light-shielding components 51, and the mesh includes multiple corners. In the embodiment of the present application, the case where the mesh includes four corners is used as an example for description. It is to be understood that the example mesh may include one, two, or three corners, which is not specifically limited in the embodiment of the present application. For example, the display panel includes two opposite long sides and two opposite short sides, but is not limited thereto. The third direction F3 is parallel to the long sides of the display panel. In the embodiment of the present application, multiple corners of the same mesh include at least two corners L, and the at least two corner L are the corners in the same mesh on a side of the corresponding light-emitting element facing the third direction F3. In other words, the first light-shielding components 51 intersect to form the mesh at least partially surrounding the corresponding light-emitting element, and the mesh forms the corners at the intersection of the first light-shielding components. In the embodiment of the present application, the corners include at least two corners L facing the third direction F3, and the second light-shielding component is located on a side of one of the at least two corners L facing the corresponding light-emitting element.

For example, the display panel 10 in the display device such as a mobile phone or a tablet computer is rectangular (or approximately rectangular) and includes two opposite short sides and two opposite long sides. Along a long side direction of the rectangle, that is, along the third direction F3, the edge of the display panel is far from the center of the display panel, so the display panel may be divided into multiple viewing regions V. Along a short side direction of the rectangle, the edge of the display panel is closer to the center of the display panel, so the display panel does not need to be divided into multiple viewing regions.

In the embodiment of the present application, the second light-shielding component 52 is provided for the light-emitting element with a low attenuation rate of the luminescent material.

On the one hand, when the human eyes are located in front of the central region to watch the display picture, the viewing angle of the human eyes relative to the central region is the front viewing angle, and the viewing angle of the human eyes relative to the edge region is the large viewing angle. In other words, the human eyes mainly receive the light emitted by the light-emitting elements located in the central region at the front viewing angle and the light emitted by the light-emitting elements located in the edge region obliquely to the human eyes. That is to say, the light emitted by the light-emitting elements in the edge region enters the human eyes at a certain angle of inclination and may be understood as the light at the large viewing angle. The visible light with different wavelengths has different degrees of attenuation at the large viewing angle. Therefore, in the third direction F3, along the direction from the edge region to the central region, the second light-shielding component 52 is disposed on a light emission side where the light is emitted obliquely to the human eyes for the light-emitting element with a low attenuation rate of the luminescent material, so as to reduce the light emission amount of the light-emitting element with a low attenuation rate of the luminescent material in this direction, accelerate the attenuation of the light intensity of the light-emitting element with a low attenuation rate of the luminescent material at the large viewing angle, and balance the color-mixed ratio of the three primary colors, thereby improving the color cast of white light picture quality.

On the other hand, when the human eyes are located in front of the edge region to watch the display picture, the viewing angle of the human eyes relative to the edge region is the front viewing angle, and the viewing angle of the human eyes relative to the central region is the large viewing angle. In other words, the human eyes mainly receive the light emitted by the light-emitting elements located in the edge region at the front viewing angle and the light emitted by the light-emitting elements located in the central region obliquely to the human eyes. That is to say, in this case, the light emitted by the light-emitting elements in the central region enters the human eyes at a certain angle of inclination and may be understood as the light at the large viewing angle. Similarly, referring to the figure, the visible light with different wavelengths has different degrees of attenuation at the large viewing angle. Therefore, in the third direction F3, along the direction from the central region to the edge region, the second light-shielding component 52 is disposed on a light emission side where the light is emitted obliquely to the human eyes for the light-emitting element with a low attenuation rate of the luminescent material, so as to reduce the light emission amount of the light-emitting element with a low attenuation rate of the luminescent material in this direction, accelerate the attenuation of the light intensity of the light-emitting element with a low attenuation rate of the luminescent material at the large viewing angle, and balance the color-mixed ratio of the three primary colors, thereby improving the color cast of white light picture quality.

Further, if the display panel is divided into different viewing regions along the short side direction, regardless of whether the human eyes are in the central region or the edge region, since the length of the display panel along the short side direction is relatively small, the light emitted by the light-emitting elements in other regions distributed along the short side direction obliquely to the human eyes has a relatively small angle of inclination. Therefore, the attenuation of the visible light is weak. During the color-mixed display of the three primary colors, the difference between the color-mixed ratio at the large viewing angle and the color-mixed ratio at the front viewing angle is small, and the generated color cast can be ignored. Therefore, in this embodiment, the light-shielding component 5 is provided differently along the long side direction of the display panel, that is, the second light-shielding component 52 is added, thereby saving the process cost.

In some optional embodiments of the present application, the mesh includes multiple corners, and at least part of the multiple corners are located on a side of the light-emitting element corresponding to the mesh facing a fourth direction; the second light-shielding component is located on a side of one of the at least part of the multiple corners; and the fourth direction is parallel to a short side of the display panel.

Figure 10:
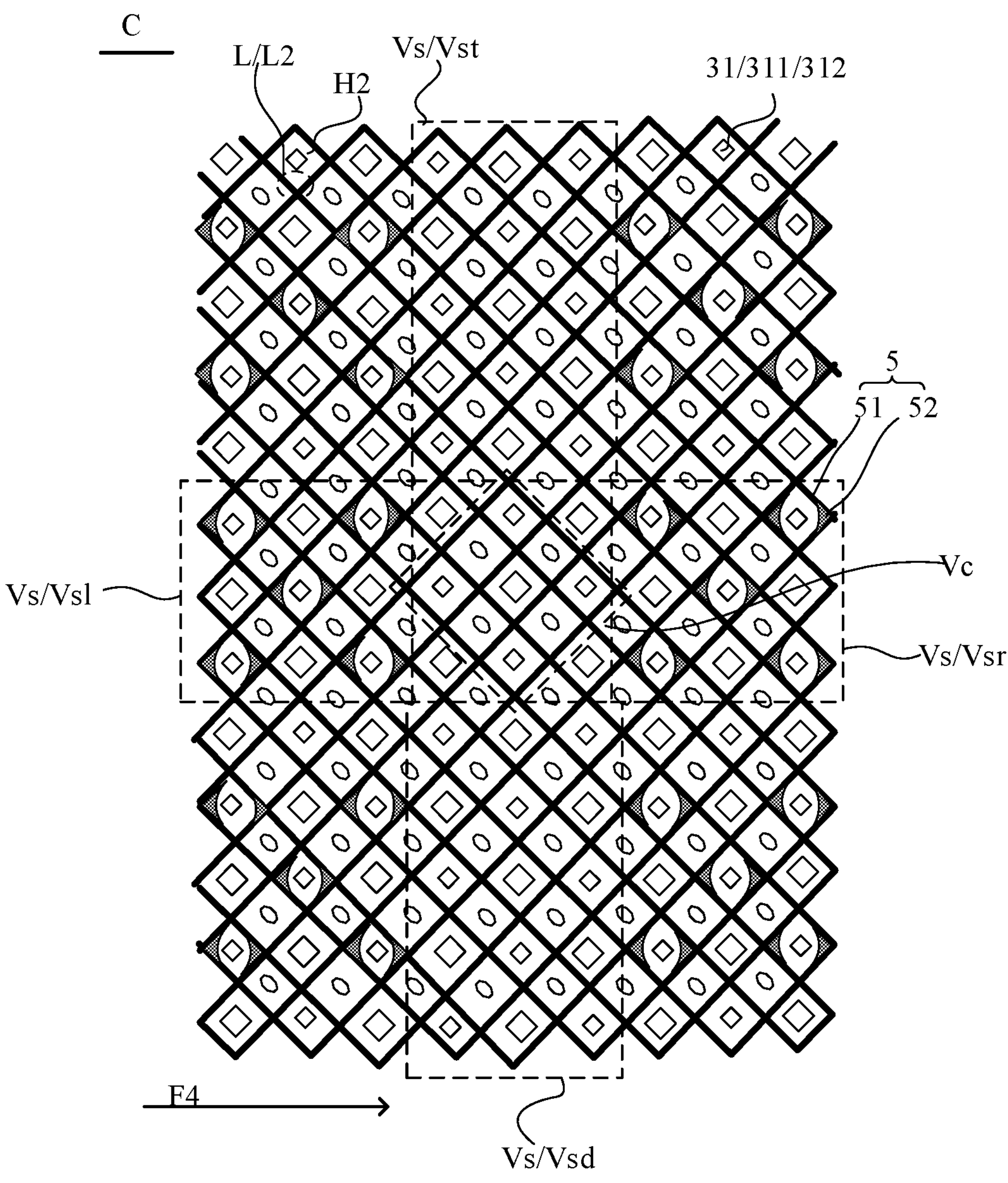
FIG. 10 is another partial enlarged top diagram of region C in FIG. 1.

Referring to FIG. 10, FIG. 10 is another partial enlarged top diagram of region C in FIG. 1. Multiple criss-cross first light-shielding components 51 intersect to form the meshes, the mesh forms the corner at the intersection of the first light-shielding components 51, and the mesh includes multiple corners. In the embodiment of the present application, the case where the mesh includes four corners is used as an example for description. It is to be understood that the example mesh may include one, two, or three corners, which is not specifically limited in the embodiment of the present application. For example, the display panel includes two opposite long sides and two opposite short sides, but is not limited thereto. The fourth direction is parallel to the short sides of the display panel. In the embodiment of the present application, multiple corners of the same mesh include at least two corners L, and the at least two corner L are the corners in the same mesh on a side of the corresponding light-emitting element facing the fourth direction. In other words, the first light-shielding components 51 intersect to form the mesh at least partially surrounding the corresponding light-emitting element, and the mesh forms the corners at the intersection of the first light-shielding components. In the embodiment of the present application, the corners include at least two corners L facing the fourth direction, and the second light-shielding component is located on a side of one of the at least two corners L facing the corresponding light-emitting element.

It is to be understood that, for a large-sized display panel, the short sides of the display panel also have a relatively large dimension. In this case, along a fourth direction F4, when the human eyes are in the central region or the edge region, since the length of the display panel along the short side direction is relatively large, the angle of inclination of the light emitted by the light-emitting elements in other regions distributed along the short side direction obliquely to the human eyes increases as the distance from other regions to the region where the human eyes are located increases. In this case, the visible light with different wavelengths has different degrees of attenuation at the large viewing angle, and the color-mixed ratio of the three primary colors at the large viewing angle is unbalanced, resulting in the more apparent color cast at the large viewing angle and affecting the display effect.

In the embodiment of the present application, the width and position of the second light-shielding component 52 are selectively set in the fourth direction for the light-emitting element whose luminescent material is attenuated slowly so that the second light-shielding component 52 is located on the inner side of the corner of the mesh corresponding to the light-emitting element facing the fourth direction F4. In this manner, the attenuation of the light intensity of the light generated by the light-emitting element with a low attenuation rate of the luminescent material facing the fourth direction F4 at the large viewing angle is accelerated, and the color-mixed ratio of the three primary colors is balanced. Therefore, different degrees of attenuation of the light emitted by the light-emitting elements in other regions distributed along the fourth direction F4 (that is, the short side direction) obliquely to the human eyes at the large viewing angle when the human eyes are located in different regions along the fourth direction are improved, and the color-mixed ratio of the three primary colors is balanced, thereby improving the color cast of white light picture quality of the display panel.

In some optional embodiments of the present application, the mesh includes multiple corners, and the second light-shielding component is located on a side of one of the multiple corners facing corresponding light-emitting elements.

Figure 11:
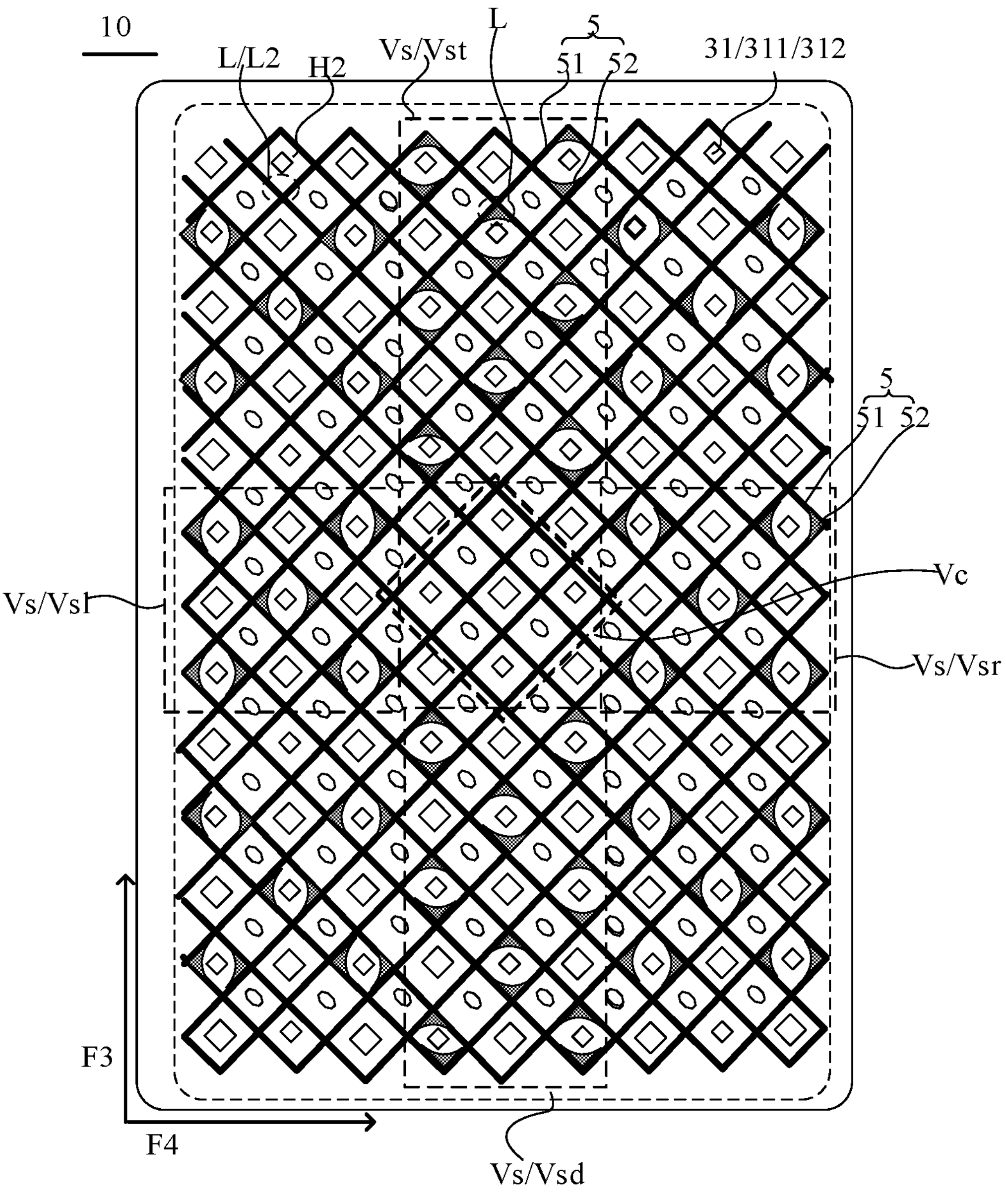
FIG. 11 is a top diagram of another display panel according to an embodiment of the present disclosure.

Referring to FIG. 11, FIG. 11 is a top diagram of another display panel according to an embodiment of the present disclosure. Optionally, multiple criss-cross first light-shielding components 51 intersect to form the meshes, the mesh forms the corner at the intersection of the first light-shielding components 51, and the mesh includes multiple corners. In the embodiment of the present application, the case where the mesh includes four corners is used as an example for description. It is to be understood that the example mesh may include one, two, or three corners, which is not specifically limited in the embodiment of the present application. In the embodiment of the present application, the second light-shielding component 52 is located on a side of the corner formed by the intersection of the first light-shielding components 51 facing the corresponding light-emitting element, that is to say, the light-shielding component 5 widens toward the corresponding light-emitting element at the corner.

In the embodiment of the present application, the second light-shielding component 52 is disposed on a side of one of the multiple corners formed by the intersection of the first light-shielding components 51 and the side of one of the multiple corners is facing the corresponding light-emitting elements. The case where the mesh includes four corners is used as an example. On the one hand, the embodiment of the present application can solve the problem described below.

For a small and medium-sized display panel, to improve the display effect, the case where the human eyes are located in the edge region does not need to be considered.

For the light-emitting element with a low attenuation rate of the luminescent material, the corresponding light-shielding component 5 separately widens along the third direction F3 and the fourth direction F4. That is to say, the light-shielding component 5 widens at the corner, that is, the second light-shielding component 52 is disposed at the corner formed by the intersection of the first light-shielding components. This is because the inventor has found through research that when the light-emitting elements are arranged, the case where the asymmetric attenuation of the light intensity of the light-emitting element with the viewing angle on a side where the second light-shielding component is disposed is more apparent than that on a side where the second light-shielding component 52 is not disposed may occur. In this manner, the asymmetric attenuation of the light emission intensity of the light-emitting element with a low attenuation rate of the luminescent material in different directions with different viewing angles is improved, the visual effect of the user is improved, and the user experience is improved. On the other hand, the color cast of the entire display panel along all directions can be improved.

Of course, when the mesh includes multiple corners, the second light-shielding component 52 may be disposed on a side of the multiple corners facing the corresponding light-emitting elements. In this case, when the human eyes are located in different regions, since the second light-shielding component 52 is provided, the light emitted by the light-emitting elements with a low attenuation rate of the luminescent material located in other regions obliquely to the human eyes can be reduced in multiple directions.

Figure 12:
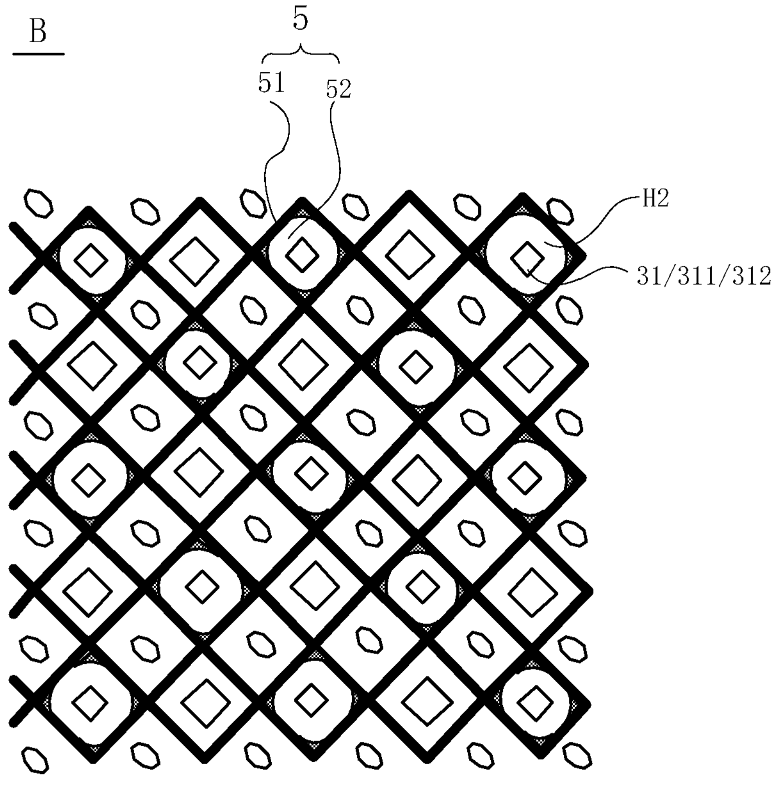
FIG. 12 is another partial enlarged top diagram of region B in FIG. 1.

Optionally, as shown in FIG. 12, FIG. 12 is another partial enlarged top diagram of region B in FIG. 1. In the embodiment of the present application, the second light-shielding component 52 is disposed on a side of one of the multiple corners formed by the intersection of the first light-shielding components 51 facing the corresponding light-emitting elements, and the second light-shielding component 52 is provided at each corner. The case where the mesh includes four corners is used as an example. In the embodiment of the present application, the relatively apparent asymmetric attenuation of the light intensity of the light-emitting element with the viewing angle can be solved, the asymmetric attenuation of the light emission intensity of the light-emitting element with a low attenuation rate of the luminescent material in different directions with different viewing angles can be improved, and the visual effect of the user can be improved.

Figure 13:
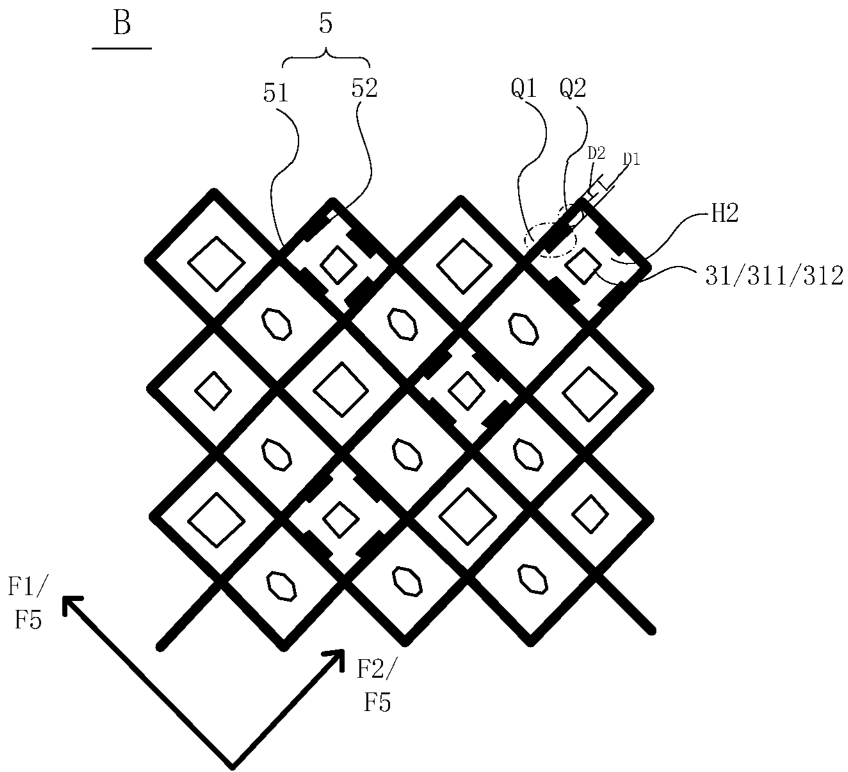
FIG. 13 is another partial enlarged top diagram of region B in FIG. 1.

As shown in FIG. 13, FIG. 13 is another partial enlarged top diagram of region B in FIG. 1.

Optionally, the second light-shielding component 52 is a strip.

Optionally, the second light-shielding component 52 is a straight line strip extending along the first light-shielding component 51 at the non-corner.

The inventor has found that for the light along a direction perpendicular to the edge of the light-emitting element, it is difficult to determine the light shielding amount of the second light-shielding component in that direction, possibly leading to the asymmetric brightness attenuation of the light-emitting element at different viewing angles.

Along a fifth direction F5, a projection of the light-emitting element 31 on the adjacent first light-shielding component 51 and a projection of the second light-shielding component 52 on the adjacent first light-shielding component 51 at least partially overlap, where the fifth direction F5 is a direction of a line connecting the first light-shielding component 51 and the light-emitting element 31 adjacent to the second light-shielding component 52, and the line is perpendicular to the first light-shielding component 51.

Optionally, the fifth direction F5 is consistent with the first direction F1 or the second direction F2.

Optionally, the boundaries of the light-emitting elements 31 in the present application may be defined by openings in the pixel defining layer.

Through this embodiment, the second light-shielding component 52 extends along a straight line of the first light-shielding component, and the projection of the light-emitting device in the fifth direction overlaps the second light-shielding component so that the effect of the second light-shielding component on the improvement of the large-viewing-angle color cast in different directions can be even.

Figure 14:
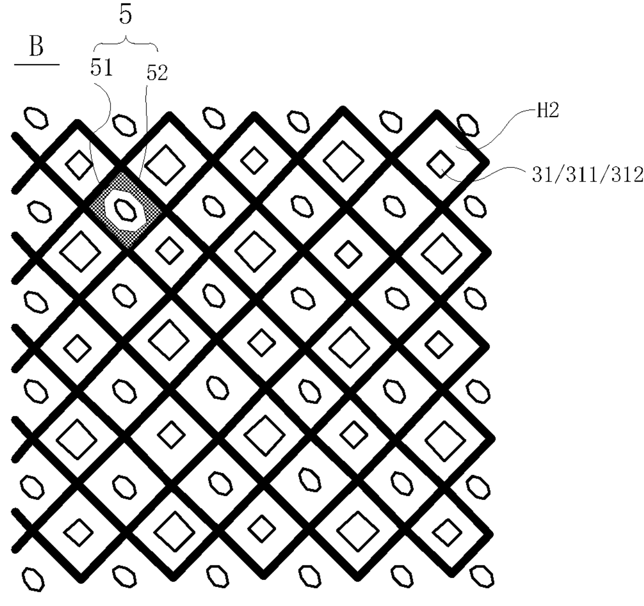
FIG. 14 is another partial enlarged top diagram of region B in FIG. 1.
Figure 15:
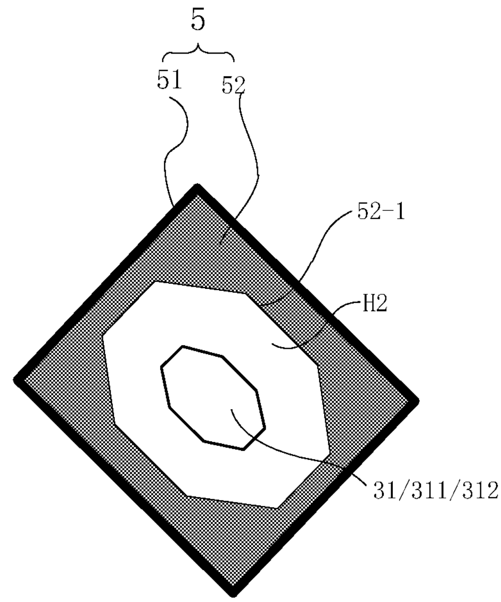
FIG. 15 is a partial enlarged top diagram of a mesh in FIG. 14.

As shown in FIGS. 14 and 15, FIG. 14 is another partial enlarged top diagram of region B in FIG. 1, and FIG. 15 is a partial enlarged top diagram of a mesh in FIG. 14.

The second light-shielding component 52 includes a first edge 52-1 adjacent to the light-emitting element 31, and the first edge 52-1 and an edge of the corresponding light-emitting element 31 have the same shape.

For example, in the case where the shape of the light-emitting element 31 is a hexagon, the outline of the first edge 52-1 is also a hexagon. The same shape here refers to the "similar" shape, and the "similar" mentioned here may mean that the same pattern is enlarged or reduced proportionally to form a similar figure in mathematics.

Figure 16:
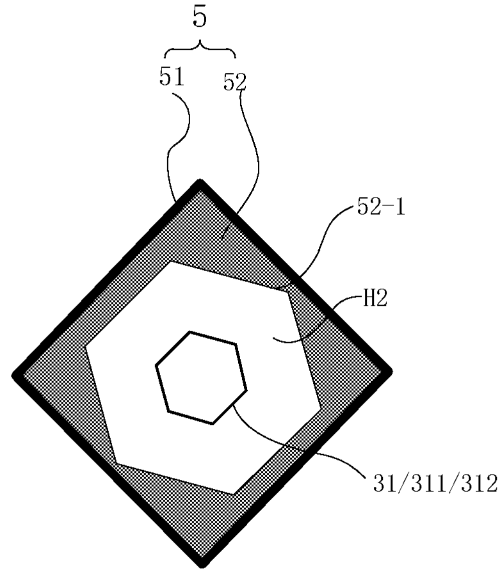
FIG. 16 is a partial enlarged top diagram of another mesh in FIG. 14.

For another example, as shown in FIG. 16, FIG. 16 is a partial enlarged top diagram of another mesh in FIG. 14.

According to the embodiment of the present application, the extension direction of the outline of a side of the second light-shielding component facing the light-emitting element is configured to be consistent with the extension direction of the outline of the light-emitting element, thereby further making the effect of the second light-shielding component on the improvement of the large-viewing-angle color cast in different directions even and further improving the display effect.

Figure 17:
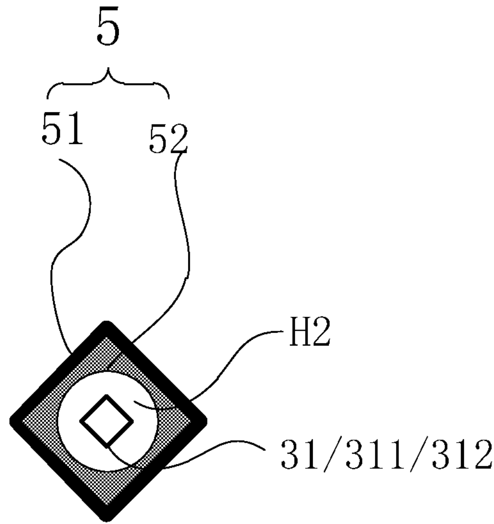
FIG. 17 is a partial enlarged top diagram of another mesh according to an embodiment of the present application.

As shown in FIG. 17, FIG. 17 is a partial enlarged top diagram of another mesh according to an embodiment of the present application.

The second light-shielding component 52 surrounds the light-emitting element 31, and a projection of the second light-shielding component on the display panel along the direction perpendicular to the plane where the display panel is located has a ring shape.

That is to say, the light-shielding component forms a mesh that is widened in all directions by the second light-shielding component. Optionally, the outline of the side of the second light-shielding component facing the light-emitting element is a circular, that is to say, the inner shape of the widened mesh is circular.

In this manner, the light emission of the light-emitting element in all directions can be improved through the second light-shielding component.

Figure 18:
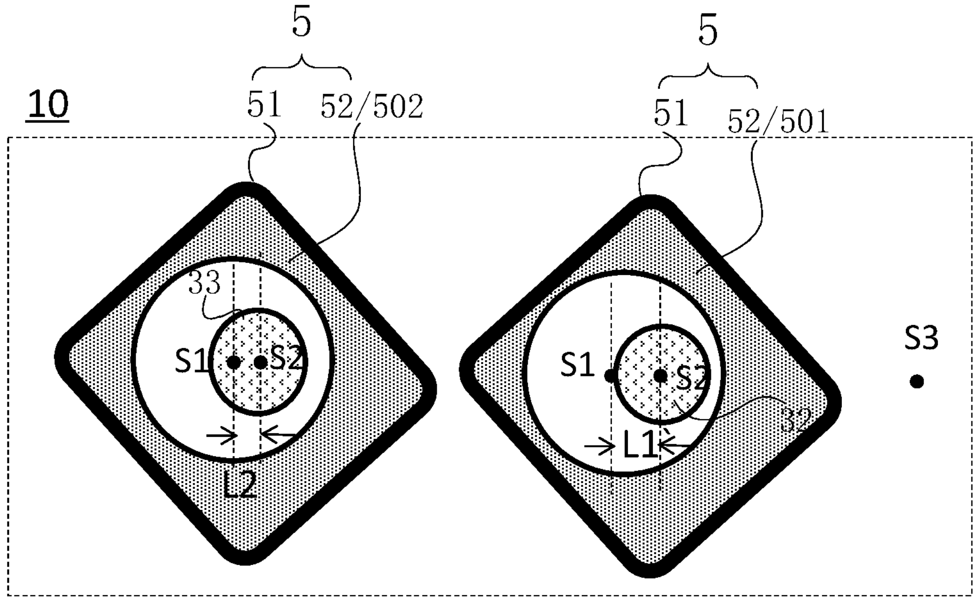
FIG. 18 is a partial enlarged top diagram of another mesh according to an embodiment of the present application.

As shown in FIG. 18, FIG. 18 is a partial enlarged top diagram of another display panel according to an embodiment of the present application. The center S1 of the ring shape is on a side of the center S2 of the corresponding light-emitting element 31 facing away from the center S3 of the display panel. That is to say, the second light-shielding component surrounding the light-emitting element is offset in a direction facing away from the center of the display panel relative to the corresponding light-emitting element.

For example, in the case where the extension direction of the outline of the side of the second light-shielding component facing the light-emitting element is consistent with the extension direction of the outline of the light-emitting element, and the outline of the side of the second light-shielding component facing the light-emitting element and the outer contour of the light-emitting element are similar shapes, but the centers of the two similar shapes do not coincide.

It is to be noted that the center S1 of the ring shape is the geometric center of the pattern surrounded by the outline of the side of the second light-shielding component facing the light-emitting element.

Through this embodiment, the offset distance of the center of the second light-shielding component changes gradually, thereby solving the problem of brightness uniformity of the display panel at the front viewing angle.

The light-emitting elements include a second light-emitting element 32 and a third light-emitting element 33, where the third light-emitting element 33 is located on a side of the second light-emitting element 32 facing away from the center S3 of the display panel; the second light-shielding components 52 include a first sub-light-shielding component 501, where the first sub-light-shielding component 501 corresponds to the second light-emitting element 32; and the second light-shielding components 52 further include a second sub-light-shielding component 502, where the second sub-light-shielding component 502 corresponds to the third light-emitting element 33; where the distance at which the center of a ring of the first sub-light-shielding component 501 is offset from the center of the second light-emitting element 32 is a first distance $L_1$, and the distance at which the center of a ring of the second sub-light-shielding component 502 is offset from the third light-emitting element 33 is a second distance $L_2$, where $L_1>L_2$.

It is to be noted that in this embodiment, the second light-emitting element 32 and the third light-emitting element 33 may each be the first light-emitting element 31 in the preceding embodiments if there is no contradiction.

Through this embodiment, the offset distance of the center of the second light-shielding component changes gradually, thereby solving the problem of brightness uniformity of the display panel at the front viewing angle.

Figure 19:
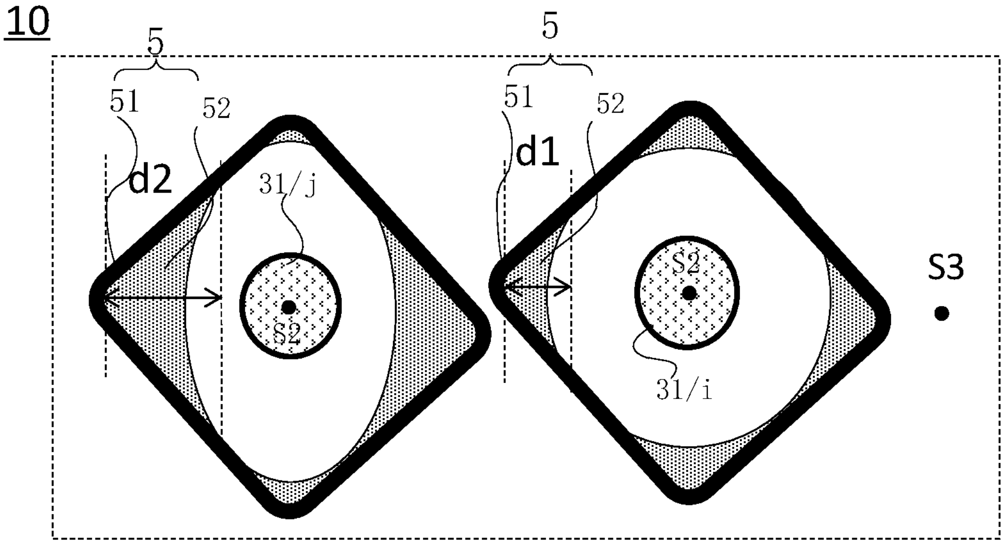
FIGS. 19 and 20 are separately partial enlarged top diagrams of two display panels according to an embodiment of the present application.
Figure 20:
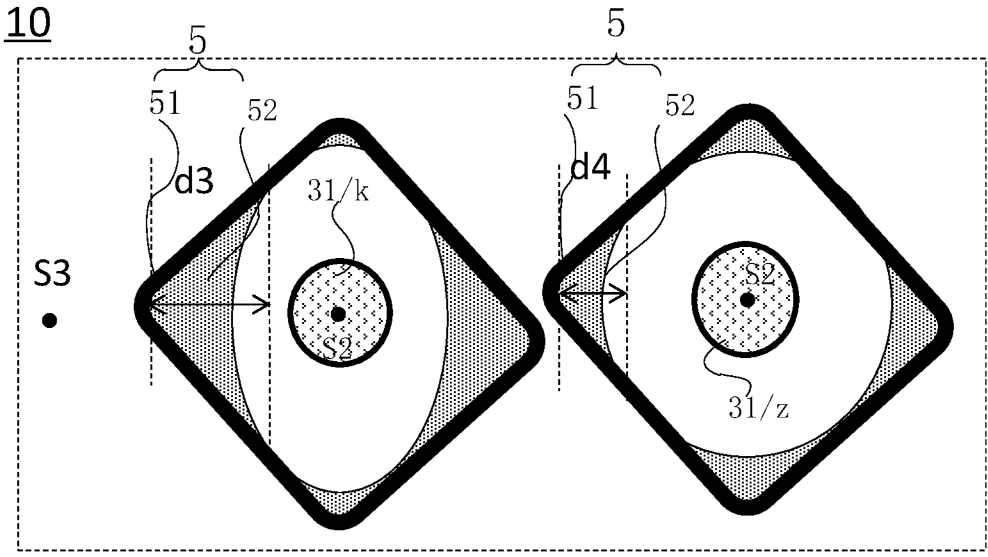

As shown in FIGS. 19 and 20, FIGS. 19 and 20 are separately partial enlarged top diagrams of two display panels according to an embodiment of the present application. The first light-emitting element 31 to the n-th light-emitting element 31 and the second light-shielding components 52 corresponding to the light-emitting elements 31 are arranged in an array in sequence along the direction from the center of the display panel to the edge of the display panel; a width of a second light-shielding component 52 covered by an orthographic projection of a line connecting an end of the second light-shielding component 52 facing away from a corresponding light-emitting element 31 and the center S2 of the corresponding light-emitting element 31 is a light-shielding width d; and the light-shielding width d varies along the direction from the center of the display panel to the edge of the display panel.

In other words, the light-shielding width may be the maximum width of the second light-shielding component in this direction (the direction of the line connecting the center of the corresponding light-emitting element and the end of the second light-shielding component facing away from the corresponding light-emitting element).

In the embodiment of the present application, the problem of brightness uniformity of the display panel at the front viewing angle is further solved.

Optionally, the width of the second light-shielding component gradually changes.

As shown in FIG. 19, the display panel includes the i-th light-emitting element 31/*i* and the j-th light-emitting element 31/*j*, where i<j. Optionally, i<j<=n.

The second light-shielding component is located on a side of the corresponding light-emitting element facing away from the center S3 of the display panel; where the light-shielding width of the second light-shielding component 52 corresponding to the i-th light-emitting element 31/*i* is a first light-shielding width $d_1$, and the light-shielding width of the second light-shielding component 52 corresponding to the j-th light-emitting element 31/*j* is a second light-shielding width $d_2$, where $d_2>d_1$.

As shown in FIG. 20, the display panel includes the k-th light-emitting element 31/*k* and the z-th light-emitting element 31/*z*, where k<z. Optionally, k<z<=n. The second light-shielding component 52 is located on a side of the corresponding light-emitting element 31 facing the center S3 of the display panel; where the light-shielding width of the second light-shielding component 52 corresponding to the k-th light-emitting element 31/*k* is a third light-shielding width $d_3$, and the light-shielding width of the second light-shielding component 52 corresponding to the z-th light-emitting element 31/*z* is a fourth light-shielding width $d_4$, where $d_4<d_3$.

In the preceding embodiments of the present application, for a side of the light-emitting element facing the center of the display panel and a side of the light-emitting element facing away from the center of the display panel, different methods for changing the light-shielding width of the second light-shielding component are used separately, thereby further solving the problem of brightness uniformity of the display panel at the front viewing angle.

Figure 21:
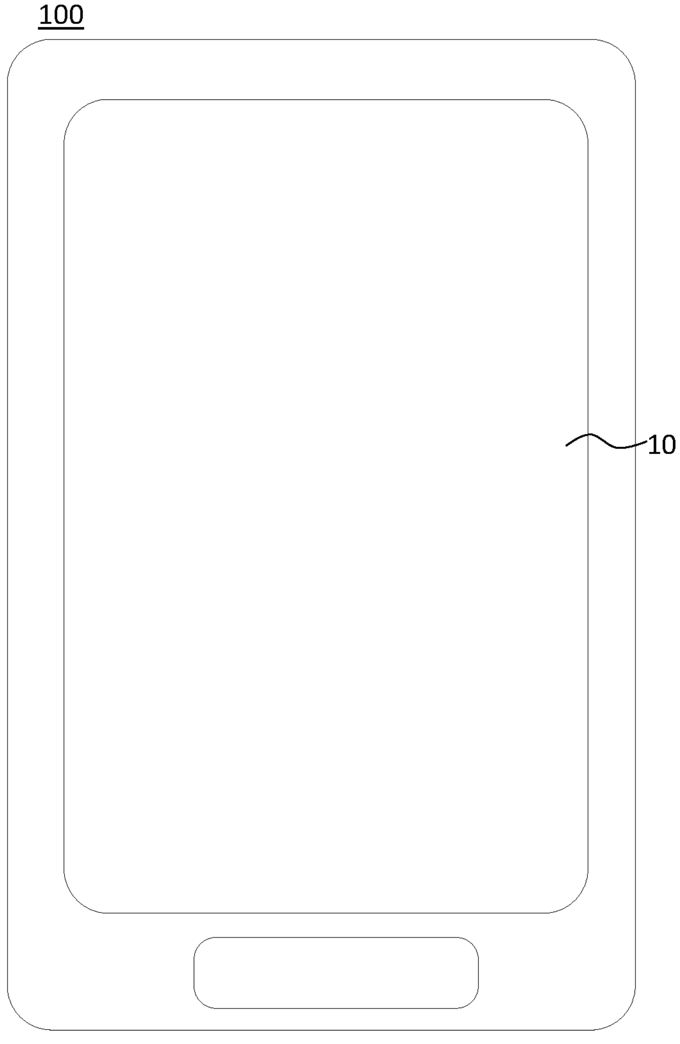
FIG. 21 is a schematic diagram of a display device according to an embodiment of the present disclosure.

The present disclosure further provides a display device. The display device includes the display panel provided by the present disclosure. As shown in FIG. 21, FIG. 21 is a structural diagram of a display device according to an embodiment of the present disclosure. A display device 100 includes the display panel 10 provided in any one of the preceding embodiments of the present disclosure. In the embodiment of FIG. 21, only the case where the display device 100 is a mobile phone is used as an example for description. It is to be understood that the display device provided in the embodiment of the present disclosure may be a computer, a television, an in-vehicle display device, and another display device with a display function, which is not specifically limited in the present disclosure. The display device provided in the embodiment of the present disclosure has the beneficial effects of the display panel provided in the embodiment of the present disclosure. For details, reference may be made to the specific description of the display panel in the preceding embodiments, and the details are not repeated here in this embodiment.

As can be seen from the preceding embodiments of the present application, the light-emitting elements may include light-emitting elements emitting blue light, green light, or red light. Specifically, blue light is the visible light with a wavelength of 435 nm to 492 nm, green light is the visible light with a wavelength of 492 nm to 577 nm, and red light is the visible light with a wavelength of 610 nm to 770 nm. The light emission intensity of the visible light with different wavelengths at the large viewing angle is attenuated. Ideally, it is hoped that the visible light with different wavelengths has the same degree of attenuation at the same viewing angle. However, in fact, the visible light with different wavelengths has different degrees of attenuation. That is to say, the light of different colors has different degrees of attenuation, leading to the color cast locus shift and changes in the color coordinates and affecting the color cast of white light picture quality at the large viewing angle of the display panel and the visual effect of the user. The light-shielding component is designed differently in the display panel and the display device provided in the present application so that the color cast caused by the inconsistent brightness attenuation of different light-emitting elements can be improved, the display uniformity of the display region of the display panel at the front viewing angle and/or the side viewing angle can be improved, the panel display quality can be improved, and the user experience can be improved.

The preceding content is a further detailed description of the present disclosure in conjunction with the specific preferred embodiments, and the specific implementation of the present disclosure is not limited to the description. For those of ordinary skill in the art to which the present disclosure pertains, a number of simple deductions or substitutions may be made without departing from the concept of the present disclosure and should fall within the scope of the present disclosure.

What is claimed is:

1. A display panel, comprising:

a base substrate;

a light-emitting element layer located on a side of the base substrate and comprising a plurality of light-emitting elements arranged in an array; and a light-shielding component located on a side of the light-emitting element layer facing away from the base substrate, wherein an orthographic projection of the light-shielding component on the base substrate is located between orthographic projections of adjacent light-emitting elements of the plurality of light-emitting elements on the base substrate;

wherein different parts of the light-shielding component have different widths along a direction parallel to a plane where the display panel is located;

wherein the light-shielding component comprises a first light-shielding component and a second light-shielding component; and along a direction parallel to the plane where the display panel is located, at least part of the first light-shielding component has a same width and the second light-shielding component is located on a side of the first light-shielding component facing a light-emitting element of the plurality of light-emitting elements.

2. The display panel of claim 1, wherein the second light-shielding component comprises a first edge adjacent to the one light-emitting element of the plurality of light-emitting elements, and the first edge and an edge of the one light-emitting element of the plurality of light-emitting elements have a same shape.

3. The display panel of claim 1, wherein the second light-shielding component is in a same layer as the first light-shielding component and is made of a same material as the first light-shielding component.

4. The display panel of claim 1, wherein the second light-shielding component and the first light-shielding component are in different layers, and wherein any metal layer among film layers of the light-emitting element layer facing a light emission side of the display panel is reused as a second light-shielding component; or wherein the second light-shielding component is additionally disposed in any film layer of the light-emitting element layer facing the light emission side of the display panel.

5. The display panel of claim 1, wherein the display panel comprises a black matrix and/or a touch electrode, wherein any one or two of the black matrix or the touch electrode is reused as the first light-shielding component or the second light-shielding component.

6. The display panel of claim 1, comprising:

an array layer located between the base substrate and the light-emitting element layer, wherein the array layer comprises a plurality of circuit elements and signal lines connecting the plurality of circuit elements, wherein the signal lines comprise a first signal line;

wherein the plurality of light-emitting elements comprise at least one first light-emitting element, and a first light-emitting element of the at least one first light-emitting element comprises an anode; wherein the anode of the first light-emitting element comprises a first part anode and a second part anode, the first part anode overlaps with an orthographic projection of the first signal line on the base substrate, the second part anode does not overlap with the orthographic projection of the first signal line on the base substrate, and the second light-shielding component is located between the second part anode and the first light-shielding component.

7. The display panel of claim 6, wherein the first light-emitting element is a blue light-emitting element.

8. The display panel of claim 1, wherein at least part of the light-shielding component adjacent to a light-emitting element of a first color has a width of D1, and at least part of the light-shielding component not adjacent to the light-emitting element of the first color has a width of D2, wherein D1>D2.

9. The display panel of claim 8, wherein the first color is green.

10. The display panel of claim 1, wherein the first light-shielding component is linear, a plurality of first light-shielding components extending along a first direction and a second direction intersect to form a mesh structure, and a mesh of meshes in the mesh structure corresponds to one light-emitting element of the plurality of light-emitting elements, wherein the first direction intersects with the second direction.

11. The display panel of claim 10, wherein a mesh of the meshes comprises at least one corner, wherein the at least one corner comprises a first corner;

the first corner is one of the at least one corner in a same mesh of the meshes and is at a side of the same mesh facing away from a center of the display panel; and the second light-shielding component is located on a side of the first corner facing a corresponding light-emitting element of the plurality of light-emitting elements.

12. The display panel of claim 10, wherein a mesh of the meshes comprises at least one corner, wherein the at least one corner comprises a second corner;

the second corner is one of the at least one corner in a same mesh of the meshes and is at a side of the same mesh adjacent to a center of the display panel; and the second light-shielding component is located on a side of the second corner facing a corresponding light-emitting element of the plurality of light-emitting elements.

13. The display panel of claim 10, wherein a mesh of the meshes comprises a plurality of corners, and at least part of the plurality of corners are located on a side of one light-emitting element corresponding to the mesh facing a third direction;

the second light-shielding component is located on a side of a corner of the at least part of the plurality of corners; and the third direction is parallel to a long side of the display panel.

14. The display panel of claim 10, wherein a mesh of the meshes comprises a plurality of corners, at least part of the plurality of corners are located on a side of one light-emitting element corresponding to the mesh facing a fourth direction;

the second light-shielding component is located on a side of a corner of the at least part of the plurality of corners; and the fourth direction is parallel to a short side of the display panel.

15. The display panel of claim 10, wherein a mesh of the meshes comprises a plurality of corners, and the second light-shielding component is located on a side of a corner of the plurality of corners facing one corresponding light-emitting element of the plurality of light-emitting elements.

16. The display panel of claim 1, wherein the second light-shielding component is a strip extending along a linear direction.

17. The display panel of claim 16, wherein along a fifth direction, a projection of the one light-emitting element of the plurality of light-emitting elements and a projection of the second light-shielding component at least partially overlap, wherein the fifth direction is a direction of a line connecting the first light-shielding component and the one light-emitting element adjacent to the second light-shielding component, and the line is perpendicular to an extension direction of the first light-shielding component.

18. The display panel of claim 10, wherein the second light-shielding component surrounds the one light-emitting element of the plurality of light-emitting elements, and a projection of the second light-shielding component on the display panel along a direction perpendicular to the plane where the display panel is located has a ring shape.

19. The display panel of claim 18, wherein a center of the ring shape is on a side of a center of the one light-emitting element of the plurality of light-emitting elements facing away from a center of the display panel.

20. The display panel of claim 19, wherein the plurality of light-emitting elements comprise a second light-emitting element and a third light-emitting element, wherein the third light-emitting element is located on a side of the second light-emitting element facing away from the center of the display panel;

the second light-shielding component comprises a first sub-light-shielding component, wherein the first sub-light-shielding component corresponds to the second light-emitting element; and the second light-shielding component further comprises a second sub-light-shielding component, wherein the second sub-light-shielding component corresponds to the third light-emitting element;

wherein a distance at which a center of a ring of the first sub-light-shielding component is offset from a center of the second light-emitting element is a first distance L, and a distance at which a center of a ring of the second sub-light-shielding component is offset from the third light-emitting element is a second distance $L_2$, wherein $L_1>L_2$.

21. The display panel of claim 10, wherein a first one of the plurality of light-emitting elements to an n-th one of the plurality of light-emitting elements are arranged in an array in sequence along a direction from a center of the display panel to an edge of the display panel;

a width of a second light-shielding component covered by an orthographic projection of a line connecting an end of the second light-shielding component facing away from one corresponding light-emitting element of the plurality of light-emitting elements and a center of the corresponding light-emitting element of the plurality of light-emitting elements is a light-shielding width; and the light-shielding width varies along the direction from the center of the display panel to the edge of the display panel.

22. The display panel of claim 21, wherein the display panel comprises an i-th one of the plurality of light-emitting elements and a j-th one of the plurality of light-emitting elements, wherein $i<j$; and a second light-shielding component is located on a side of a corresponding light-emitting element of the plurality of light-emitting elements facing away from the center of the display panel;

wherein a light-shielding width of a second light-shielding component corresponding to the i-th one of the plurality of light-emitting elements is a first light-shielding width di, and a light-shielding width of a second light-shielding component corresponding to the j-th one of the plurality of light-emitting elements is a second light-shielding width $d_2$, wherein $d_2>d_1$.

23. The display panel of claim 21, wherein the display panel comprises a k-th one of the plurality of light-emitting elements and a z-th one of the plurality of light-emitting elements, wherein $k<z$; and a second light-shielding component is located on a side of a corresponding light-emitting element of the plurality of light-emitting elements facing the center of the display panel;

wherein a light-shielding width of a second light-shielding component corresponding to the k-th one of the plurality of light-emitting elements is a third light-shielding width $d_3$, and a light-shielding width of a second light-shielding component corresponding to the z-th one of the plurality of light-emitting elements is a fourth light-shielding width $d_4$, wherein $d_4<d_3$.

24. A display device, comprising a display panel, wherein the display panel, comprising:

a base substrate;

a light-emitting element layer located on a side of the base substrate and comprising a plurality of light-emitting elements arranged in an array; and a light-shielding component located on a side of the light-emitting element layer facing away from the base substrate, wherein an orthographic projection of the light-shielding component on the base substrate is located between orthographic projections of adjacent light-emitting elements of the plurality of light-emitting elements on the base substrate;

wherein different parts of the light-shielding component have different widths along a direction parallel to a plane where the display panel is located;

wherein the light-shielding component comprises a first light-shielding component and a second light-shielding component; and along a direction parallel to the plane where the display panel is located, at least part of the first light-shielding component has a same width and the second light-shielding component is located on a side of the first light-shielding component facing a light-emitting element of the plurality of light-emitting element.

* * * * *